US012672423B2

(12) United States Patent
Lee et al.

(10) Patent No.: US 12,672,423 B2
(45) Date of Patent: Jun. 30, 2026

(54) DISPLAY DEVICE

(71) Applicant: Samsung Display Co., Ltd., Yongin-Si (KR)

(72) Inventors: Dae-Young Lee, Yongin-si (KR); Sangwoo Kim, Yongin-si (KR); Hyeonsik Kim, Yongin-si (KR); Kwang Soo Bae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 398 days.

(21) Appl. No.: 18/125,876

(22) Filed: Mar. 24, 2023

(65) Prior Publication Data

US 2023/0329018 A1 Oct. 12, 2023

(30) Foreign Application Priority Data

Apr. 6, 2022 (KR) ........................ 10-2022-0042954

(51) Int. Cl.
*H10K 59/40* (2023.01)
*G06F 3/041* (2006.01)
*G06V 40/13* (2022.01)
*H10K 39/34* (2023.01)
*H10K 59/80* (2023.01)

(52) U.S. Cl.
CPC ........... *H10K 39/34* (2023.02); *G06F 3/0412* (2013.01); *G06V 40/1318* (2022.01);
(Continued)

(58) Field of Classification Search
CPC ........ G06F 3/41–047; G06F 2203/041–04114; G06F 3/0412; H10K 59/60; H10K 59/40;
(Continued)

(56) References Cited

U.S. PATENT DOCUMENTS 11,158,258 B2 10/2021 Cha et al.
2019/0213380 A1* 7/2019 Joo .................... G06V 40/1318
(Continued)

FOREIGN PATENT DOCUMENTS

KR 10-2017-0132639 A 12/2017
KR 10-2021-0055699 5/2021
(Continued)

*Primary Examiner* — Sanjiv D. Patel
(74) *Attorney, Agent, or Firm* — F. CHAU & ASSOCIATES, LLC

(57) ABSTRACT

A display device includes: a base layer including a light emitting area, a sensing area, and a non-light-emitting area disposed between the light emitting area and the sensing area; a light emitting element disposed in the light emitting area; an optical sensing element disposed in the sensing area; a capping layer disposed on the light emitting element and the optical sensing element and overlapping the light emitting area, the sensing area, and the non-light-emitting area; an inorganic layer disposed on the capping layer and including a first opening overlapping the sensing area; and a thin film encapsulation layer disposed on the inorganic layer and including a first encapsulation inorganic layer, an encapsulation organic layer disposed on the first encapsulation inorganic layer, and a second encapsulation inorganic layer disposed on the encapsulation organic layer.

19 Claims, 15 Drawing Sheets

(52) U.S. Cl.
CPC ........... *H10K 59/40* (2023.02); *H10K 59/873* (2023.02); *H10K 59/879* (2023.02); *H10K 59/8792* (2023.02)

(58) Field of Classification Search
CPC ............. H10K 59/8792; H10K 50/865; H10K 50/844; H10K 59/873; H10K 59/122; H10K 59/121; H10K 59/65; G06V 40/1318
See application file for complete search history.

(56) References Cited

U.S. PATENT DOCUMENTS

| | | | | |
|---|---|---|---|---|
| 2020/0168671 | A1* | 5/2020 | Jang | G06F 3/0443 |
| 2020/0365664 | A1* | 11/2020 | Jeon | H10K 59/121 |
| 2021/0158751 | A1* | 5/2021 | Cha | H10K 59/65 |
| 2021/0167144 | A1* | 6/2021 | Lim | H10K 59/875 |
| 2021/0183971 | A1* | 6/2021 | Kim | H10K 59/122 |
| 2021/0327979 | A1 | 10/2021 | Kamada et al. | |
| 2022/0173174 | A1 | 6/2022 | Hatsumi et al. | |

FOREIGN PATENT DOCUMENTS

| | | | | | |
|---|---|---|---|---|---|
| KR | 10-2021-0064483 | | | 6/2021 | |
| KR | 10-2021-0069254 | A | | 6/2021 | |
| KR | 10-2021-0069776 | | | 6/2021 | |
| KR | 20220007826 | A | * | 1/2022 | H10K 59/879 |
| KR | 20220058720 | A | * | 5/2022 | H10K 59/12 |
| WO | 2020/165686 | | | 8/2020 | |

* cited by examiner

DISPLAY DEVICE

CROSS-REFERENCE TO RELATED APPLICATION

This U.S. non-provisional patent application claims priority under 35 U.S.C. § 119 to Korean Patent Application No. 10-2022-0042954, filed on Apr. 6, 2022, the disclosure of which is incorporated by reference herein in its entirety.

TECHNICAL FIELD

The present invention relates to a display device. More particularly, the present invention relates to a display device capable of recognizing biometric information.

DISCUSSION OF THE RELATED ART

Generally, display devices provide a variety of functions to communicate with a user, such as displaying images to provide information to the user or sensing a user input. In recent years, the display devices have been under development to include various functions to sense biometric information of the user.

To sense the biometric information of the user, various methods have been used, such as a capacitance method that senses a variation in capacitance between electrodes, an optical method that senses an incident light using an optical sensor, and an ultrasonic method that senses a vibration using a piezoelectric material.

SUMMARY

According to an embodiment of the present invention, a display device includes: a base layer including a light emitting area, a sensing area, and a non-light-emitting area disposed between the light emitting area and the sensing area; a light emitting element disposed in the light emitting area; an optical sensing element disposed in the sensing area; a capping layer disposed on the light emitting element and the optical sensing element and overlapping the light emitting area, the sensing area, and the non-light-emitting area; an inorganic layer disposed on the capping layer and including a first opening overlapping the sensing area; and a thin film encapsulation layer disposed on the inorganic layer and including a first encapsulation inorganic layer, an encapsulation organic layer disposed on the first encapsulation inorganic layer, and a second encapsulation inorganic layer disposed on the encapsulation organic layer.

In an embodiment of the present invention, the capping layer and the inorganic layer satisfy the following Equation 1 of $$T1+T2=\left\{\frac{\lambda}{4}\times\frac{1}{n1}\right\}+\left\{\frac{\lambda}{4}\times\frac{1}{n2}\right\},$$

wherein $\lambda$ denotes a wavelength of a visible light, T1 denotes a thickness of the capping layer, T2 denotes a thickness of the inorganic layer, n1 denotes a refractive index of the capping layer at the $\lambda$ wavelength, and n2 denotes a refractive index of the inorganic layer at the $\lambda$ wavelength.

In an embodiment of the present invention, the inorganic layer includes bismuth.

In an embodiment of the present invention, the capping layer includes an organic material.

In an embodiment of the present invention, the capping layer includes α-NPD, NPB, TPD, m-MTDATA, Alq3, CuPc, TPD15(N4,N4,N4',N4'-tetra (biphenyl-4-yl) biphenyl-4,4'-diamine), TCTA(4,4',4"-Tris(carbazol sol-9-yl) triphenylamine), an epoxy resin, or an acrylate resin.

In an embodiment of the present invention, the display device further includes an input sensing electrode disposed on the thin film encapsulation layer.

In an embodiment of the present invention, the input sensing electrode includes second openings overlapping the light emitting area and the sensing area.

In an embodiment of the present invention, the display device further includes a light blocking pattern disposed on the input sensing electrode and overlapping the non-light-emitting area.

In an embodiment of the present invention, the light blocking pattern includes third openings overlapping the second openings.

In an embodiment of the present invention, the first opening overlaps a corresponding third opening among the third openings, and the corresponding third opening is disposed inside the first opening when viewed in a plane.

In an embodiment of the present invention, the display device further includes a light absorbing layer disposed on the input sensing electrode, wherein the light absorbing layer absorbs a light having a wavelength ranging from about 490 nm to about 505 nm and a light having a wavelength ranging from about 585 nm to about 600 nm.

In an embodiment of the present invention, the light absorbing layer overlaps the light emitting area, the sensing area, and the non-light-emitting area.

In an embodiment of the present invention, the light absorbing layer includes a base resin and a dye or a pigment mixed with the base resin.

In an embodiment of the present invention, the first encapsulation inorganic layer is in contact with the capping layer via the first opening.

In an embodiment of the present invention, the capping layer includes a fourth opening overlapping the first opening.

In an embodiment of the present invention, the light emitting element includes first color light emitting elements, second color light emitting elements, and third color light emitting elements, wherein one first color light emitting element, two second color light emitting elements, and one third color light emitting element form a unit light emitting element, and two optical sensing elements are disposed to correspond to the unit light emitting element.

In an embodiment of the present invention, the light emitting element includes first color light emitting elements, second color light emitting elements, and third color light emitting elements, and the optical sensing element is disposed at a center of an area defined by one first color light emitting element, two second color light emitting elements, and one third color light emitting element.

According to an embodiment of the present invention, a display device includes: a base layer including a light emitting area, a sensing area, and a non-light-emitting area disposed between the light emitting area and the sensing area; a light emitting element disposed in the light emitting area and including a first electrode, a second electrode disposed on the first electrode, and a light emitting layer disposed between the first electrode and the second electrode; an optical sensing element disposed in the sensing area and including a first electrode, a second electrode disposed on the first electrode, and a photoelectric conversion layer disposed between the first electrode and the second electrode; an organic layer disposed on the second electrode of the light emitting element and the second electrode of the optical sensing element, and overlapping the light emitting area, the sensing area, and the non-light-emitting area; an inorganic layer disposed on the organic layer and including a first opening overlapping the sensing area; and a thin film encapsulation layer disposed on the inorganic layer and including a first encapsulation inorganic layer, an encapsulation organic layer disposed on the first encapsulation inorganic layer, and a second encapsulation inorganic layer disposed on the encapsulation organic layer, wherein a first reflected light reflected by the inorganic layer is destructively interfered with a second reflected light reflected by the second electrode of the light emitting element or the second electrode of the optical sensing element.

In an embodiment of the present invention, the inorganic layer includes bismuth.

In an embodiment of the present invention, the display device further includes a light absorbing layer disposed on the thin film encapsulation layer, wherein the light absorbing layer absorbs a light having a wavelength ranging from about 490 nm to about 505 nm and a light having a wavelength ranging from about 585 nm to about 600 nm.

BRIEF DESCRIPTION OF THE DRAWINGS

The above and other features of the present invention will become more apparent by describing in detail embodiments thereof with reference to the accompanying drawings, in which.

DETAILED DESCRIPTION OF THE EMBODIMENTS

Figure 1:
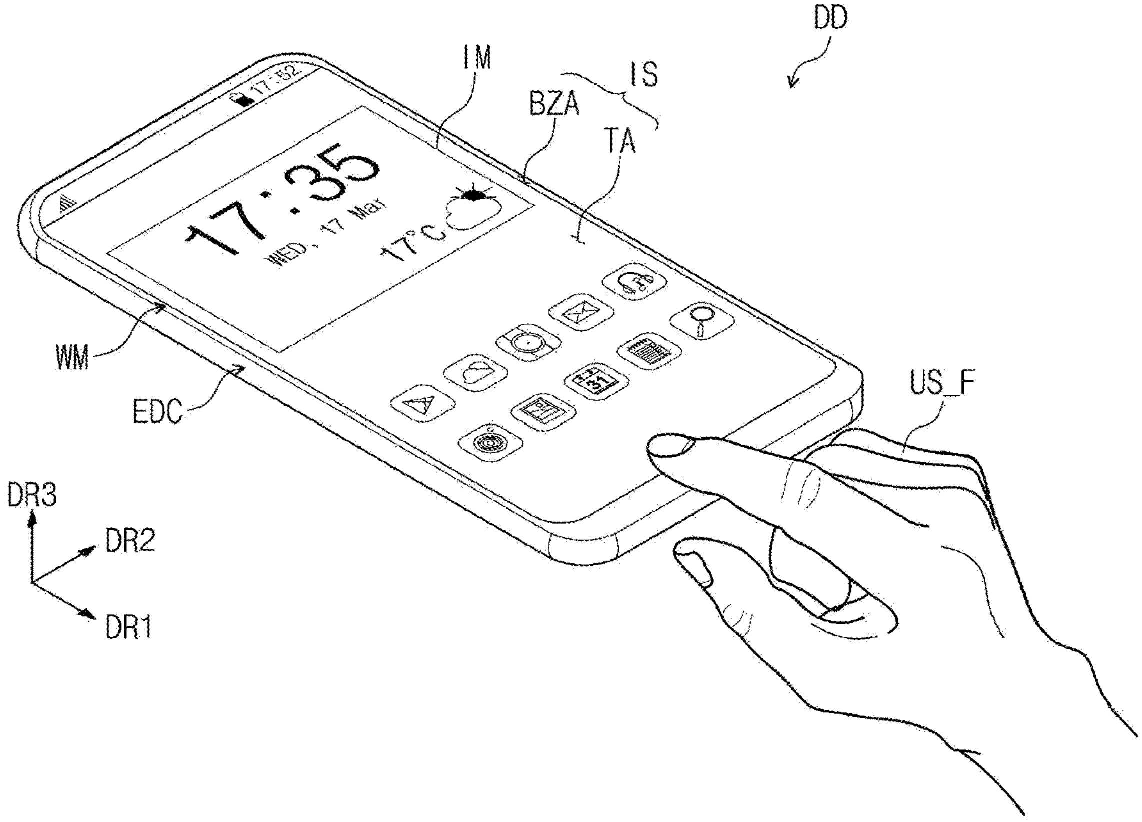
FIG. 1 is a perspective view of a display device according to an embodiment of the present invention.

In the present disclosure, it will be understood that when an element (or area, layer, or portion) is referred to as being "on", "connected to" or "coupled to" another element or layer, the element can be directly on, connected or coupled to the other element or layer or intervening elements or layers may be present.

Like numerals may refer to like elements throughout the specification. In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. For example, a first element discussed below could be termed a second element without departing from the teachings of the present invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures. It will be understood that the spatially relative terms are intended to encompass different orientations of the device in use or operation in addition to the orientation depicted in the figures. For example, if the device in the figures is turned over, components described as "below" or "beneath" other components or features would then be oriented "above" the other components or features.

Hereinafter, embodiments of the present invention will be described with reference to accompanying drawings.

Figure 2:
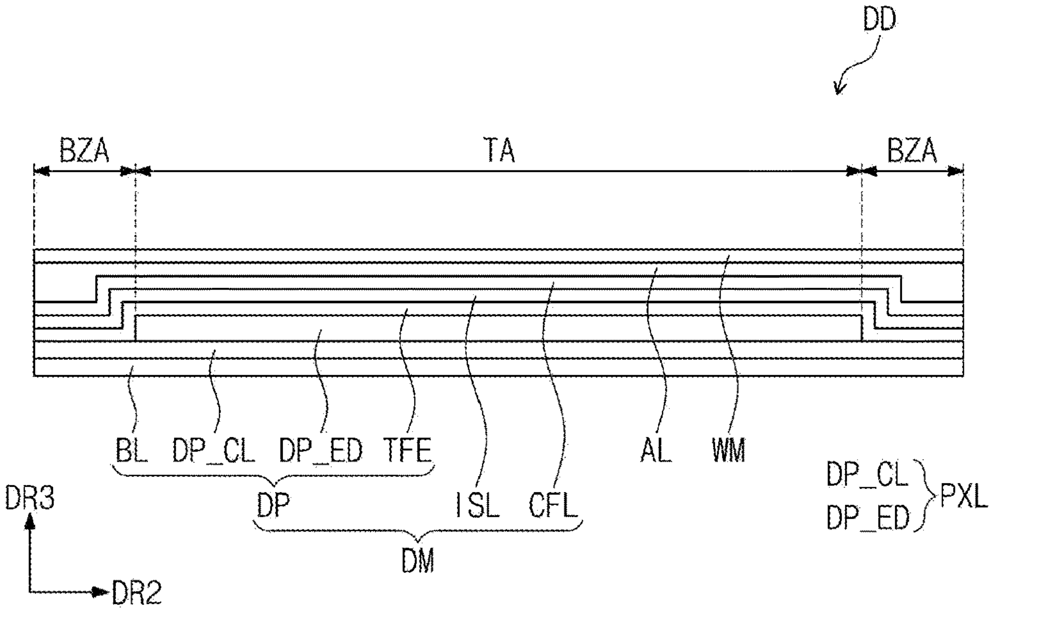
FIG. 2 is a cross-sectional view of a display device according to an embodiment of the present invention.

FIG. 1 is a perspective view of a display device DD according to an embodiment of the present invention. FIG. 2 is a cross-sectional view of the display device DD according to an embodiment of the present invention.

Referring to FIGS. 1 and 2, the display device DD may have a rectangular shape with long sides in a first direction DR1 and short sides in a second direction DR2 crossing the first direction DR1. However, the shape of the display device DD should not be limited to the rectangular shape, and the display device DD may have a variety of shapes, such as a circular shape, a polygonal shape, or the like. For example, the display device DD may have a rectangular shape with rounded corners.

The display device DD may be activated in response to electrical signals. The display device DD may be applied to various electronic devices. For example, the display device DD may be applied to electronic devices, such as a smart watch, a tablet computer, a notebook computer, a computer, or a smart television, etc.

Hereinafter, a normal line direction substantially perpendicular to a plane defined by the first direction DR1 and the second direction DR2 is referred to as a third direction DR3. In the following descriptions, the expression "when viewed in a plane" or "on a plane" may mean a state of being viewed in the third direction DR3.

An upper surface of the display device DD may be defined as a display surface IS and may be substantially parallel to the plane defined by the first direction DR1 and the second direction DR2. Images IS generated by the display device DD may be provided to a user through the display surface IS.

The display surface IS of the display device DD may be divided into a transmission area TA and a bezel area BZA. The images IM may be displayed through the transmission area TA. The user may view the images IM through the transmission area TA. In the present embodiment, the transmission area TA may have a quadrangular shape with rounded vertices. However, this is merely one example, and the transmission area TA may have a variety of shapes and should not be particularly limited thereto.

The bezel area BZA may be adjacent to the transmission area TA. The bezel area BZA may have a predetermined color. The bezel area BZA may at least partially surround the transmission area TA. Accordingly, the shape of the transmission area TA may be defined by the bezel area BZA, however, this is merely one example. According to an embodiment of the present invention, the bezel area BZA may be disposed adjacent to only one side of the transmission area TA or may be omitted.

The display device DD may sense an external input applied thereto from the outside. The external input may include a variety of external inputs provided from the outside. For example, the external input may include an external input (e.g., a hovering input) applied when in proximity to or approaching close to the display device DD at a predetermined distance as well as a touch input by a user's body, e.g., a finger of the user US_F or by an additional device, e.g., an active pen, a digitizer, or the like. In addition, the external input may include various forms, such as force, pressure, temperature, or light.

The display device DD may sense biometric information of the user, which is applied thereto from the outside. The display device DD may include a biometric information sensing area provided in the display surface IS to sense the biometric information of the user. The biometric information sensing area may be provided in an entire portion of the transmission area TA or may be provided in a portion of the transmission area TA. FIG. 1 shows, as an example, a structure in which the entire portion of the transmission area TA is used as the biometric information sensing area.

The display device DD may include a window WM, a display module DM, and a housing EDC. In the present embodiment of the present invention, the window WM and the housing EDC may be coupled with each other to form an appearance of the display device DD. The window WM and the housing EDC are connected to each other to form an inner space in which components of the display device DD may be disposed.

A front surface of the window WM may provide the display surface IS of the display device DD. The window WM may include an optically transparent insulating material. For example, the window WM may include a glass or plastic material. The window WM may have a single-layer or multi-layer structure. As an example, the window WM may include a plurality of plastic films coupled to each other by an adhesive or a glass substrate and a plastic film coupled to the glass substrate by an adhesive.

The display module DM may include a display panel DP and an input sensor ISL. The display panel DP may display the images IM in response to electrical signals, and the input sensor ISL may sense an external input applied thereto from the outside. The external input may be provided in various forms.

The display panel DP according to an embodiment of the present invention may be a light-emitting type display panel, however, the present invention should not be particularly limited thereto. For instance, the display panel DP may be an organic light emitting display panel or an inorganic light emitting display panel. A light emitting layer of the organic light emitting display panel may include an organic light emitting material. A light emitting layer of the inorganic light emitting display panel may include an inorganic light emitting material, e.g., a quantum dot or a quantum rod. Hereinafter, the organic light emitting display panel will be described as a representative example of the display panel DP.

Referring to FIG. 2, the display panel DP may include a base layer BL, a pixel layer PXL, and a thin film encapsulation layer TFE. For example, the display panel DP may be a flexible display panel, however, the present invention should not be limited thereto or thereby. As an example, the display panel DP may be a foldable display panel folded with respect to a folding axis or may be a rigid display panel.

The base layer BL may include a synthetic resin layer. For example, the synthetic resin layer may be a polyimide-based resin layer, however, a material for the synthetic resin layer should not be particularly limited thereto. In addition, the base layer BL may include a glass substrate, a metal substrate, or an organic/inorganic composite material substrate.

The pixel layer PXL may be disposed on the base layer BL. The pixel layer PXL may include a circuit layer DP_CL and an element layer DP_ED. The circuit layer DP_CL may be disposed between the base layer BL and the element layer DP_ED. The circuit layer DP_CL may include at least one insulating layer and a circuit element. Hereinafter, the insulating layer included in the circuit layer DP_CL is referred to as an intermediate insulating layer. The intermediate insulating layer may include at least one intermediate inorganic layer and at least one intermediate organic layer. The circuit element may include, for example, a pixel driving circuit and a sensor driving circuit. The pixel driving circuit may be included in each of pixels displaying the images, and the sensor driving circuit may be included in each of sensors recognizing external information. The external information may be the biometric information. As an example, the sensor may be a fingerprint recognition sensor, a proximity sensor, and an iris recognition sensor. In addition, the sensor may be an optical sensor that recognizes the biometric information in an optical manner. The circuit layer DP_CL may further include signal lines connected to the pixel driving circuit and/or the sensor driving circuit.

The element layer DP_ED may include a light emitting element included in each of the pixels and an optical sensing element included in each of the sensors. As an example, the optical sensing element may be a photodiode. The optical sensing element may be a sensor that senses a light reflected by a user's fingerprint or responds to the light. The circuit layer DP_CL and the element layer DP_ED will be described in detail later.

The thin film encapsulation layer TFE may encapsulate the element layer DP_ED. The thin film encapsulation layer TFE may include, for example, at least one organic layer and at least one inorganic layer.

The input sensor ISL may be disposed on the display panel DP. The input sensor ISL may be disposed on the thin film encapsulation layer TFE. For example, the input sensor ISL may be disposed directly on the thin film encapsulation layer TFE. The input sensor ISL may be formed on the display panel DP through successive processes. For example, an adhesive member might not be disposed between the input sensor ISL and the display panel DP.

The input sensor ISL may sense the external input, e.g., a user's touch, may convert the external input to a predetermined input signal, and may apply the input signal to the display panel DP. The input sensor ISL may include a plurality of input sensing electrodes (hereinafter, referred to as sensing electrodes) to sense the external input. The sensing electrodes may sense the external input by a mutual capacitance method or a self-capacitance method. The display panel DP may receive an input signal from the input sensor ISL and may generate an image corresponding to the input signal.

The display module DM may further include an anti-reflective layer CFL. The anti-reflective layer CFL may absorb natural light incident thereto from the outside of the display device DD or may absorb a light in a specific wavelength range of the natural light, and thus, an amount of reflection of the external light may be reduced. As an example, the anti-reflective layer CFL may be disposed on the input sensor ISL, however, the present invention should not be limited thereto or thereby. The anti-reflective layer CFL will be described in detail later.

The display device DD may further include an adhesive layer AL. The window WM may be attached to the input sensor ISL by the adhesive layer AL. For example, the adhesive layer AL may include an optically clear adhesive (OCA), an optically clear adhesive resin (OCR), or a pressure sensitive adhesive (PSA).

The housing EDC may be coupled to the window WM. The housing EDC and the window WM coupled to the housing EDC may provide a predetermined inner space. The display module DM may be accommodated in the inner space. The housing EDC may include a material with a relatively high rigidity. For example, the housing EDC may include a glass, plastic, or metal material or a plurality of frames and/or plates of combinations thereof. The housing EDC may stably protect the components of the display device DD accommodated in the inner space from external impacts. A battery module may be disposed between the display module DM and the housing EDC to supply a power source for an overall operation of the display device DD.

Figure 3:
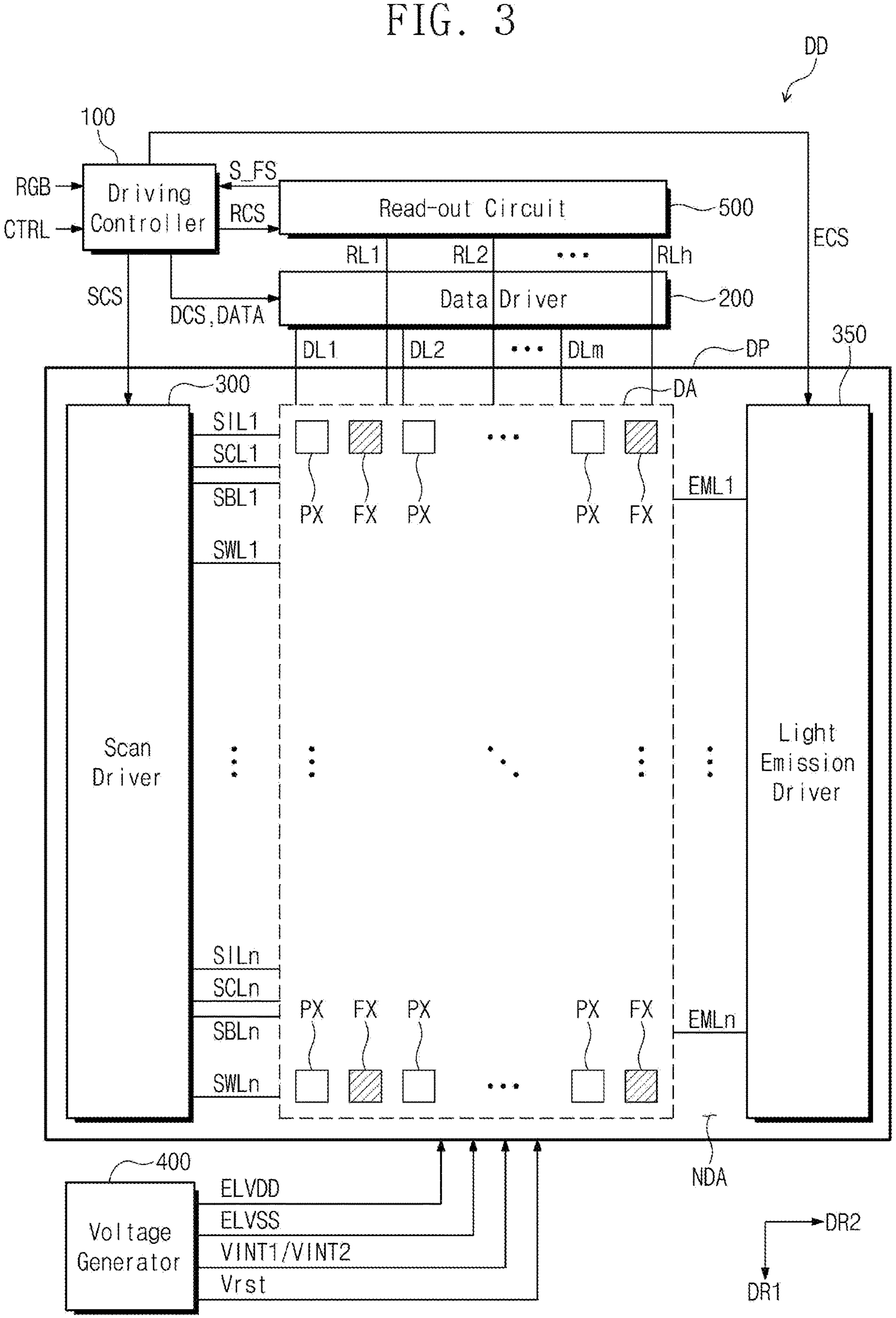
FIG. 3 is a block diagram of a display device according to an embodiment of the present invention.

FIG. 3 is a block diagram of the display device DD according to an embodiment of the present invention.

Referring to FIG. 3, the display device DD may include the display panel DP, a driving controller 100, and a driving circuit. As an example, the driving circuit may include a data driver 200, a scan driver 300, a light emission driver 350, a voltage generator 400, and a read-out circuit 500. For example, the voltage generator 400 and the read-out circuit 500 may be implemented in a single driving chip with the driving controller 100; however, the present invention is not limited thereto.

The driving controller 100 may receive an image signal RGB and control signals CTRL. The driving controller 100 may convert a data format of the image signal RGB to a data format appropriate to an interface between the data driver 200 and the driving controller 100 to generate an image data signal DATA. The driving controller 100 may generate a first control signal SCS, a second control signal ECS, a third control signal DCS, and a fourth control signal RCS.

The data driver 200 may receive the third control signal DCS and the image data signal DATA from the driving controller 100. The data driver 200 may convert the image data signal DATA to data signals and may output the data signals to a plurality of data lines DL1 to DLm described later. The data signals may be analog voltages corresponding to grayscale values of the image data signal DATA.

The scan driver 300 may receive the first control signal SCS from the driving controller 100. The scan driver 300 may output scan signals to scan lines in response to the first control signal SCS.

The voltage generator 400 may generate voltages operating the display panel DP. In the present embodiment, the voltage generator 400 may generate a first driving voltage ELVDD, a second driving voltage ELVSS, a first initialization voltage VINT1, and a second initialization voltage VINT2.

The display panel DP may include a display area DA corresponding to the transmission area TA (refer to FIG. 1) and a non-display area NDA corresponding to the bezel area BZA (refer to FIG. 1).

The display panel DP may include a plurality of pixels PX and a plurality of sensors FX. The plurality of pixels PX may be disposed in the display area DA, and the plurality of sensors FX may be disposed in the display area DA. As an example, each of the sensors FX may be disposed between two pixels PX adjacent to each other. The pixels PX and the sensors FX may be alternately arranged with each other in the first and second directions DR1 and DR2, however, the present invention should not be limited thereto or thereby. For example, two or more pixels PX may be disposed between two sensors FX adjacent to each other in the first direction DR1 among the sensors FX, or two or more pixels PX may be disposed between two sensors FX adjacent to each other in the second direction DR2 among the sensors FX.

The display panel DP may include initialization scan lines SIL1 to SILn, compensation scan lines SCL1 to SCLn, write scan lines SWL1 to SWLn, black scan lines SBL1 to SBLn, light emission control lines EML1 to EMLn, the data lines DL1 to DLm, and read-out lines RL1 to RLh. The initialization scan lines SIL1 to SILn, the compensation scan lines SCL1 to SCLn, the write scan lines SWL1 to SWLn, the black scan lines SBL1 to SBLn, and the light emission control lines EML1 to EMLn may extend in the second direction DR2. The initialization scan lines SIL1 to SILn, the compensation scan lines SCL1 to SCLn, the write scan lines SWL1 to SWLn, the black scan lines SBL1 to SBLn, and the light emission control lines EML1 to EMLn may be arranged in the first direction DR1 and may be spaced apart from each other in the first direction DR1. The data lines DL1 to DLm and the read-out lines RL1 to RLh may extend in the first direction DR1 and may be arranged spaced apart from each other in the second direction DR2.

The pixels PX may be electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm. For example, each of the pixels PX may be electrically connected to four scan lines. However, the number of the scan lines connected to each of the pixels PX should not be limited thereto or thereby.

The sensors FX may be electrically connected to the write scan lines SWL1 to SWLn and the read-out lines RL1 to RLh. Each of the sensors FX may be electrically connected to one scan line, however, the present invention should not be limited thereto or thereby. The number of the scan lines connected to each of the sensors FX may vary. As an example, the number of the read-out lines RL1 to RLh may correspond to a half (½) of the number of the data lines DL1 to DLm, however, the present invention should not be limited thereto or thereby. In addition, the number of the read-out lines RL1 to RLh may correspond to a ¼ or ⅛ of the number of the data lines DL1 to DLm.

The scan driver 300 may be disposed in the non-display area NDA of the display panel DP. The scan driver 300 may receive the first control signal SCS from the driving controller 100. In response to the first control signal SCS, the scan driver 300 may output initialization scan signals to the initialization scan lines SIL1 to SILn and may output compensation scan signals to the compensation scan lines SCL1 to SCLn. In addition, in response to the first control signal SCS, the scan driver 300 may output write scan signals to the write scan lines SWL1 to SWLn and may output black scan signals to the black scan lines SBL1 to SBLn. In addition, the scan driver 300 may include first and second scan drivers. The first scan driver may output the initialization scan signals and the compensation scan signals, and the second scan driver may output the write scan signals and the black scan signals.

The light emission driver 350 may be disposed in the non-display area NDA of the display panel DP. The light emission driver 350 may receive the second control signal ECS from the driving controller 100. The light emission driver 350 may output light emission control signals to the light emission control lines EML1 to EMLn in response to the second control signal ECS. According to an embodiment of the present invention, the scan driver 300 may be connected to the light emission control lines EML1 to EMLn. In this case, the light emission driver 350 may be omitted, and the scan driver 300 may output the light emission control signals to the light emission control lines EML1 to EMLn.

The read-out circuit 500 may receive the fourth control signal RCS from the driving controller 100. The read-out circuit 500 may receive sensing signals from the read-out lines RL1 to RLh in response to the fourth control signal RCS. The read-out circuit 500 may process the sensing signals from the read-out lines RL1 to RLh and may provide the processed sensing signals S_FS to the driving controller 100. The driving controller 100 may recognize the biometric information based on the sensing signals S_FS.

Figure 4:
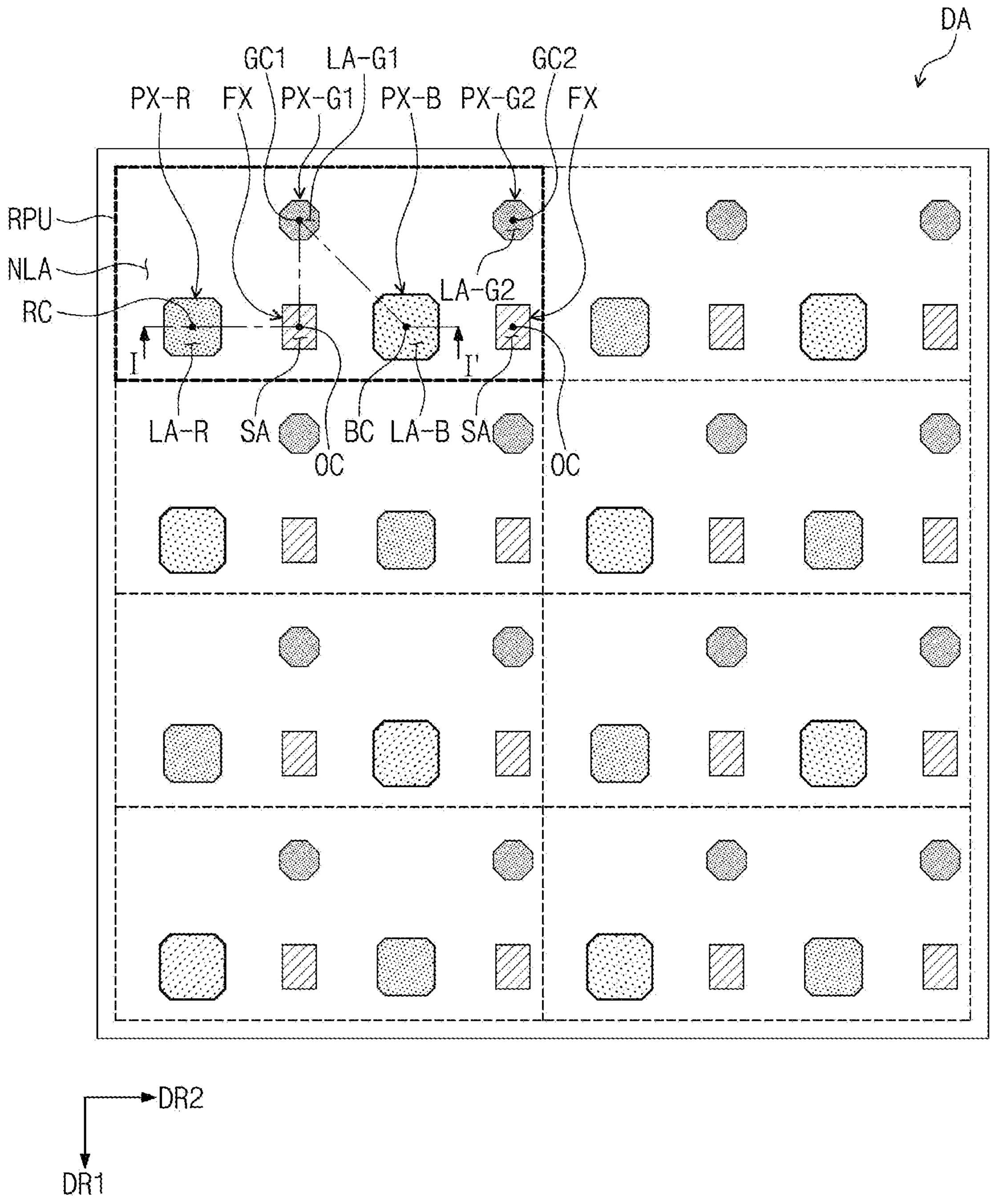
FIG. 4 is an enlarged plan view of a portion of a display panel according to an embodiment of the present invention.

FIG. 4 is an enlarged plan view of a portion of the display area DA according to an embodiment of the present invention.

FIG. 4 shows unit areas RPU repeatedly arranged in the display area DA. A unit pixel and at least one sensor FX may be disposed in each of the unit areas RPU. The unit pixel may be a group of pixels, and the group of pixels may be provided in plural and may be repeatedly arranged.

The unit pixel may include a first color pixel PX-R, two second color pixels PX-G1 and PX-G2, and a third color pixel PX-B. In the present embodiment, a first color may be a red color. Further, a second color may be a green color, and a third color may be a blue color. In the present embodiment, the first color pixel PX-R may generate a red source light (hereinafter, referred to as a red light). Further, second color pixels PX-G1 and PX-G2 may generate a green source light (hereinafter, referred to as a green light), and the third color pixel PX-B may generate a blue source light (hereinafter, referred to as a blue light).

The red light may have a wavelength equal to or greater than about 580 nm and equal to or smaller than about 675 nm, and a center wavelength range may be equal to or greater than about 610 nm and equal to or smaller than about 645 nm. The green light may have a wavelength equal to or greater than about 510 nm and equal to or smaller than about 570 nm, and a center wavelength range may be equal to or greater than about 515 nm and equal to or smaller than about 545 nm. The blue light may have a wavelength equal to or greater than about 410 nm and equal to or smaller than about 480 nm, and a center wavelength range may be equal to or greater than about 440 nm and equal to or smaller than about 460 nm. In the present embodiment, the center wavelength range may be a range in which a peak wavelength may be placed.

In the present embodiment, two sensors FX may be disposed in each of the unit areas RPU. The first color pixel PX-R may include a first color light emitting element. In addition, each of the two second color pixels PX-G1 and PX-G2 may include a second color light emitting element, and the third color pixel PX-B may include a third color light emitting element.

FIG. 4 shows a first light emitting area LA-R of the first color light emitting element, second light emitting areas LA-G1 and LA-G2 of the second color light emitting elements, and a third light emitting area LA-B of the third color light emitting element. Among the first light emitting area LA-R, the second light emitting areas LA-G1 and LA-G2, and the third light emitting area LA-B, the third light emitting area LA-B has the largest size (e.g., planar area), and the second light emitting areas LA-G1 and LA-G2 have the smallest size (e.g., planar area). In addition, a sensing area SA of the optical sensing element of the two sensors FX is shown in FIG. 4. One first color light emitting element, two second color light emitting elements, and one third color light emitting element may define a unit light emitting element, and one first light emitting area LA-R, two second light emitting areas LA-G1 and LA-G2, and one third light emitting area LA-B may define a unit light emitting area.

The unit areas RPU arranged in the second direction DR2 may have the same pixel arrangement as each other, and the positions of the first color pixel PX-R and the third color pixel PX-B may be changed in each of the unit areas RPU arranged in the first direction DR1. Among the unit areas RPU, first type unit areas may be alternately arranged with second type unit areas along the first direction DRL.

Referring to each of the unit areas RPU, the second light emitting areas LA-G1 and LA-G2 may be aligned with each other in the second direction DR2. Center points GC1 and GC2 of the second light emitting areas LA-G1 and LA-G2 may be aligned with each other in the second direction DR2. In the first direction DR1, each of the sensing areas SA may be aligned with a corresponding second light emitting area among the second light emitting areas LA-G1 and LA-G2. In the first direction DR1, center points OC of the sensing areas SA may be aligned with the center points GC1 and GC2 of the second light emitting areas LA-G1 and LA-G2.

In the second direction DR2, the first light emitting area LA-R, the third light emitting area LA-B, and the sensing areas SA may be aligned with each other. In the second direction DR2, a center point RC of the first light emitting area LA-R, a center point BC of the third light emitting area LA-B, and the center point OC of the sensing areas SA may be aligned with each other. One sensing area SA may be disposed between the first light emitting area LA-R and the third light emitting area LA-B, and one of the first light emitting area LA-R and the third light emitting area LA-B may be disposed between two sensing areas SA that are adjacent to each other.

Referring to FIG. 4, each of the sensing areas SA may be disposed at a center of an area defined by the first light emitting area LA-R, the third light emitting area LA-B, and the two second light emitting areas LA-G1 and LA-G2 regardless the type of the unit areas RPU. For example, the center area may be between the first light emitting area LA-R and the third light emitting area LA-B. Each of the sensing areas SA may be disposed between the first light emitting area LA-R and the third light emitting area LA-B in the second direction DR2 and may be disposed between two second light emitting areas LA-G and between two second light emitting areas LA-G2 in the first direction DR1.

Figure 5A:
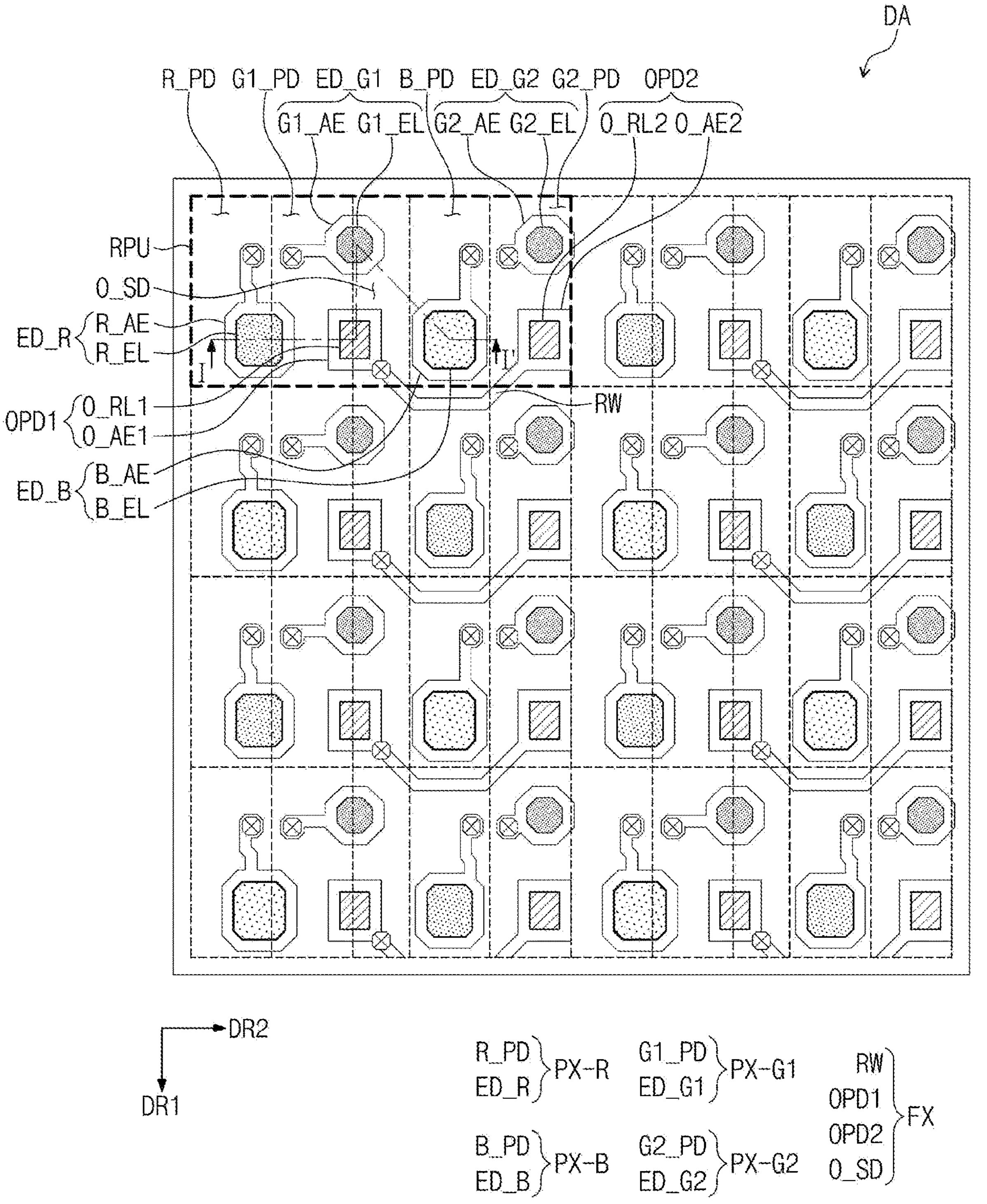
FIG. 5A is a plan view of a connection relationship between an optical sensing element and a sensor driving circuit according to an embodiment of the present invention.
Figure 5B:
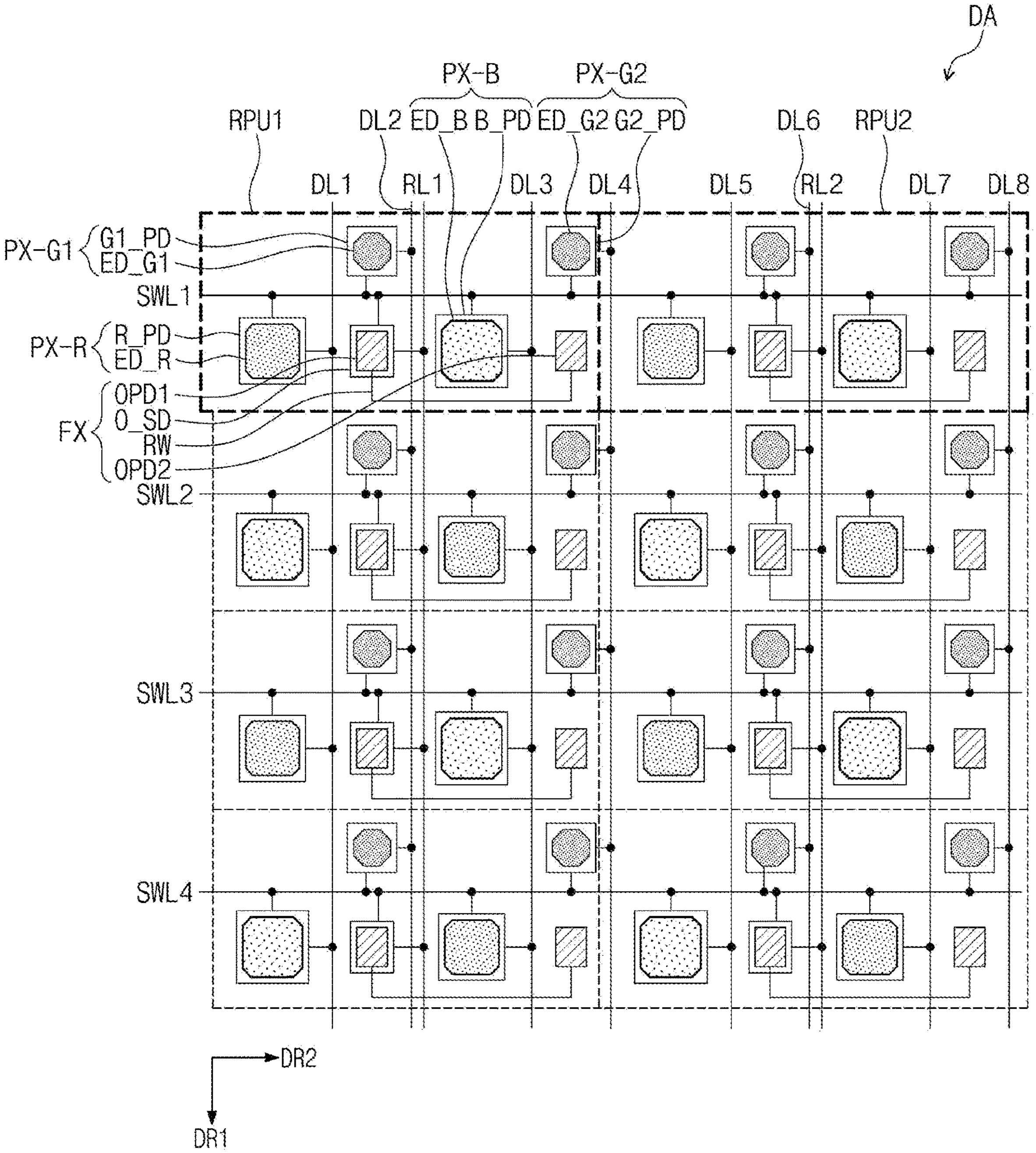
FIG. 5B is a circuit diagram of the connection relationship between the optical sensing element and the sensor driving circuit shown in FIG. 5A according to an embodiment of the present invention.
Figure 5C:
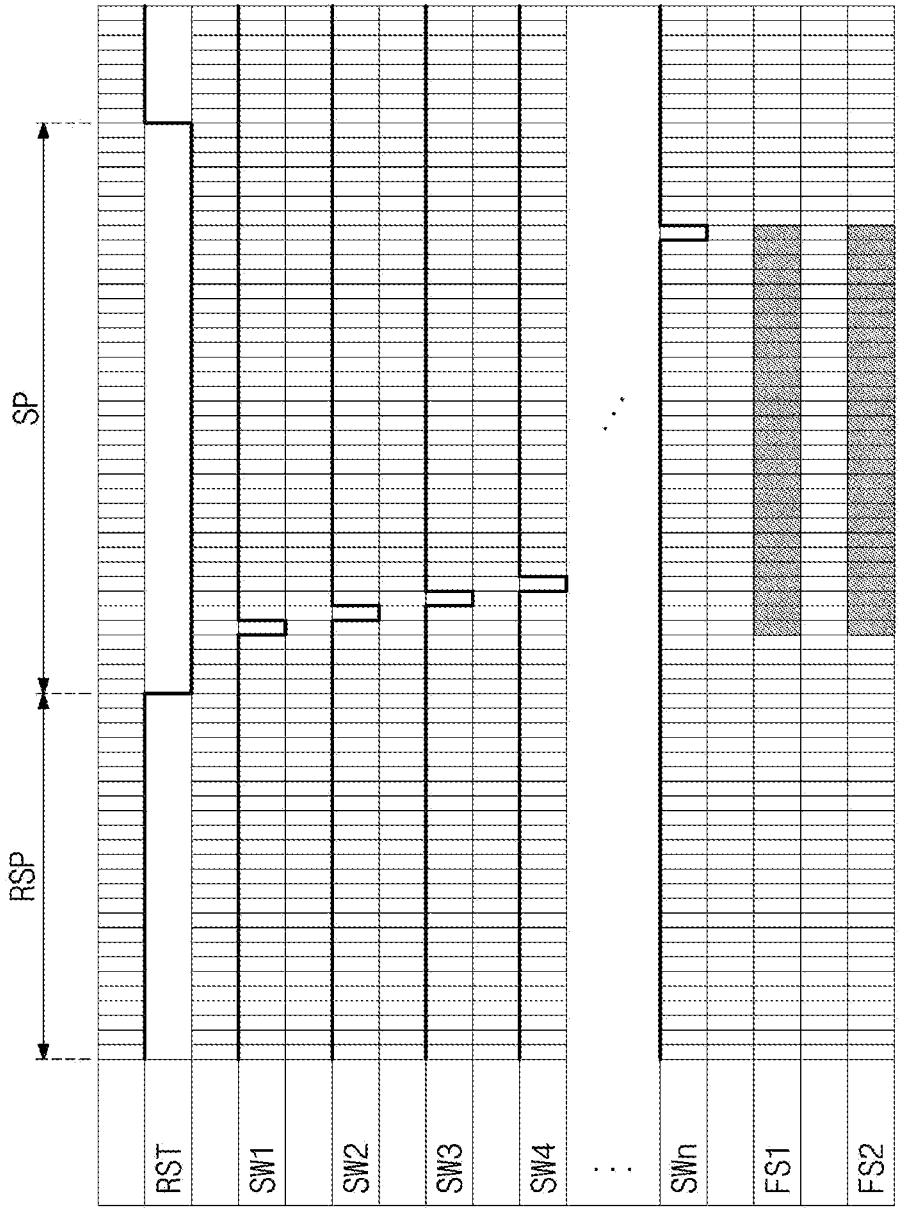
FIG. 5C is a waveform diagram of a read-out timing of sensors shown in FIG. 5B according to an embodiment of the present invention.

FIG. 5A is a plan view of a connection relationship between the light emitting element and the pixel driving circuit and a connection relationship between the optical sensing element and the sensor driving circuit according to an embodiment of the present invention. FIG. 5B is a circuit diagram of the connection relationship between the light emitting element and the pixel driving circuit and the connection relationship between the optical sensing element and the sensor driving circuit shown in FIG. 5A. FIG. 5C is a waveform diagram of a read-out timing of sensors shown in FIG. 5B according to an embodiment of the present invention.

Hereinafter, the first color pixel PX-R may be a red pixel. The second color pixels PX-G1 and PX-G2 may be a green pixel, and the third color pixel PX-B may be a blue pixel. In addition, the first color light emitting element may be a red light emitting element ED_R. The second color light emitting element may be a green light emitting element ED_G, and the third color light emitting element may be a blue light emitting element ED_B. In addition, the first light emitting area LA-R, the second light emitting area LA-G1, and the third light emitting area LA-B may be a red light emitting area LA-R, a green light emitting area LA-G1, and a blue light emitting area LA-B, respectively.

Referring to FIG. 5A, a first electrode R_AE and a light emitting layer R_EL of the red light emitting element ED_R may correspond to the red light emitting area LA-R shown in FIG. 4. A first electrode G1_AE and a light emitting layer G1_EL of a first green light emitting element ED_G1 may correspond to one of the second light emitting areas LA-G1 and LA-G2, and a first electrode G2_AE and a light emitting layer G2_EL of a second green light emitting element ED_G2 may correspond to the other of the second light emitting areas LA-G1 and LA-G2. A first electrode B_AE and a light emitting layer B_EL of the blue light emitting element ED_B may correspond to the third light emitting area LA-B. A first electrode O_AE1 and a photoelectric conversion layer O_RL1 of a first optical sensing element OPD1 may correspond to one of the two sensing areas SA within the unit area RPU, and a first electrode O_AE2 and a photoelectric conversion layer O_RL2 of a second optical sensing element OPD2 may correspond to the other of the two sensing areas SA.

A pixel driving circuit R_PD of the red pixel PX-R, a pixel driving circuit G1_PD of a first green pixel PX-G1, a pixel driving circuit G2_PD of a second green pixel PX-G2, a pixel driving circuit B_PD of the blue pixel PX-B, and a sensor driving circuit O_SD may be disposed in the unit area RPU.

Each of the first electrodes R_AE, G1_AE, G2_AE, and B_AE of the light emitting elements ED_R, ED_G1, ED_G2, and ED_B may be electrically connected to a corresponding pixel driving circuit among the pixel driving circuits R_PD, G1_PD, G2_PD, and B_PD. For instance, the red light emitting element ED_R may be electrically connected to the pixel driving circuit R_PD. For example, the first electrode R_AE of the red light emitting element ED_R may be connected to the corresponding pixel driving circuit R_PD via a contact hole.

The sensor FX may include the first optical sensing element OPD1, the second optical sensing element OPD2, and the sensor driving circuit O_SD. In the present embodiment, the first optical sensing element OPD1 and the second optical sensing element OPD2 may be electrically connected to one sensor driving circuit O_SD. The sensor FX may further include a routing line RW electrically connecting the first and second optical sensing elements OPD1 and OPD2 to each other. The first electrode O_AE1 of the first optical sensing element OPD1 may be connected to the first electrode O_AE2 of the second optical sensing element OPD2 via the routing line RW, and the first electrode O_AE1 of the first optical sensing element OPD1 may be connected to the sensor driving circuit O_SD via a contact hole. According to an embodiment of the present invention, the first optical sensing element OPD1 and the second optical sensing element OPD2 may be connected to different sensor driving circuits O_SD from each other. This case is the same as a structure in which two sensors FX are disposed in one unit area RPU.

FIG. 5B schematically shows the connection relationship between the write scan lines SWL1 to SWL4, the read-out lines RL1 and RL2, and the data lines DL1 to DL8 and the pixels PX-R, PX-G1, PX-G2, and PX-B and the sensor FX. Descriptions will be made based on a first unit area RPU1 and a second unit area RPU2, which are arranged in the second direction DR2.

Each of the pixels PX-R, PX-G1, PX-G2, and PX-B may be connected to four scan lines, for example, the write scan line, the compensation scan line, the initialization scan line, and the black scan line. For the convenience of explanation and clarity, FIG. 5B shows only one scan line (e.g., the write scan line) among the four scan lines.

FIG. 5B shows four write scan lines SWL1 to SWL4 among the write scan lines SWL1 to SWLn (refer to FIG. 3), eight data lines DL1 to DL8 among the data lines DL1 to DLm (refer to FIG. 3), and two read-out lines RL1 and RL2 among the read-out lines RL1 to RLh (refer to FIG. 3).

The pixels PX-R, PX-G1, PX-G2, and PX-B arranged in the first unit area RPU1 may be connected to a first write scan line SWL1 and first to fourth data lines DL1 to DL4. The pixels PX-R, PX-G1, PX-G2, and PX-B arranged in the second unit area RPU2 may be connected to the first write scan line SWL1 and fifth to eighth data lines DL5 to DL8. The sensor FX disposed in the first unit area RPU1 may be connected to the first write scan line SWL1 and a first read-out line RL1, and the sensor FX disposed in the second unit area RPU2 may be connected to the first write scan line SWL1 and a second read-out line RL2.

Referring to FIGS. 5B and 5C, the sensor driving circuit O_SD may output first and second sensing signals FS1 and FS2 to the first and second read-out lines RL1 and RL2, respectively, during an activation period of the write scan signals SW1 to SW4 applied to the corresponding write scan lines SWL1 to SWL4. A period in which the first and second sensing signals FS1 and FS2 are output may be defined as a sensing period SP. A period in which the sensor driving circuit O_SD is reset prior to the sensing period SP is defined as a reset period RSP. The reset period RSP and the sensing period SP may be alternately repeated. According to an embodiment of the present invention, a plurality of sensing periods SP may be positioned between two reset periods RSP.

Figure 6A:
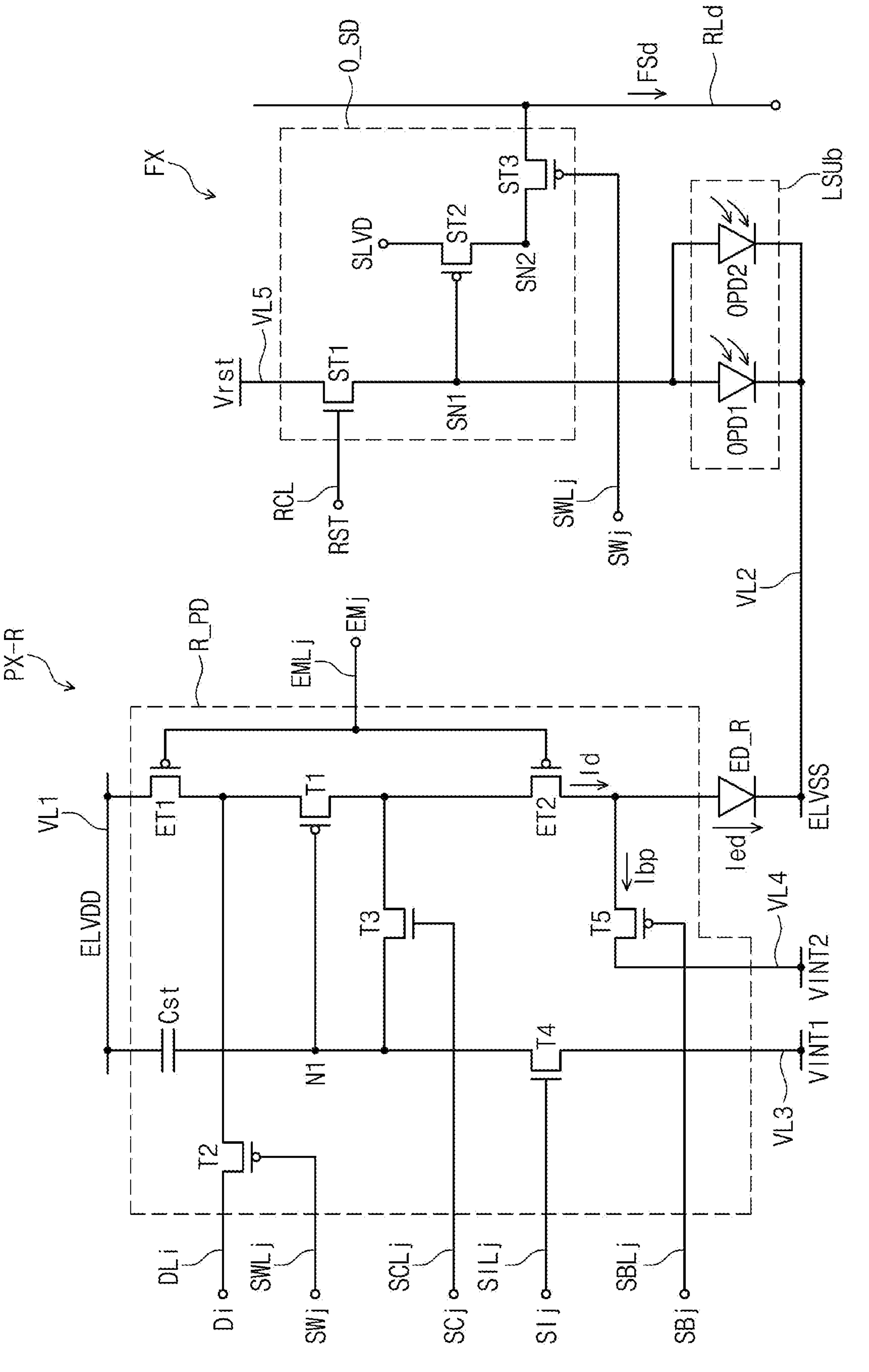
FIG. 6A is a circuit diagram of a pixel and a sensor according to an embodiment of the present invention.
Figure 6B:
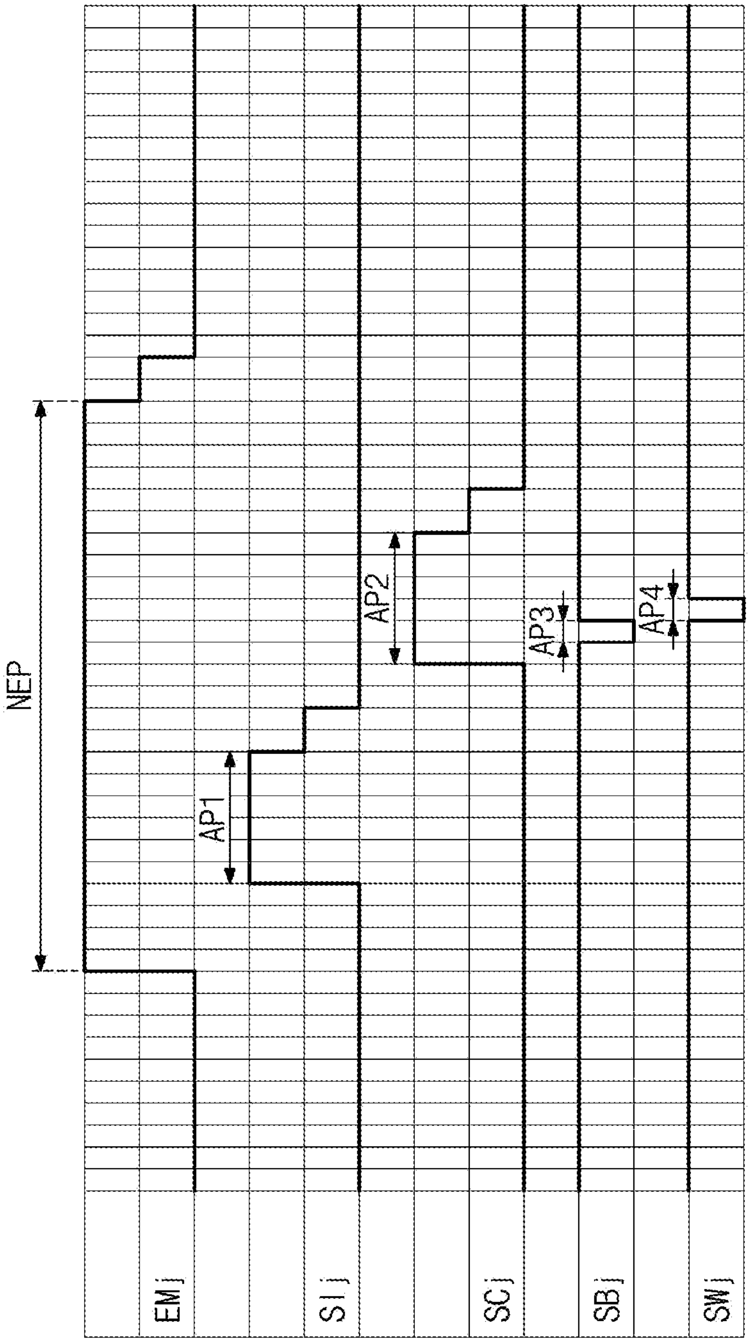
FIG. 6B is a waveform diagram illustrating an operation of the pixel and the sensor of FIG. 6A.

FIG. 6A is a circuit diagram of the pixel PX-R and the sensor FX according to an embodiment of the present invention, and FIG. 6B is a waveform diagram illustrating an operation of the pixel PX-R and the sensor FX of FIG. 6A.

FIG. 6A shows an equivalent circuit diagram of the red pixel PX-R among the pixels PX shown in FIG. 3. Since the pixels PX may have substantially the same circuit structure as one another, descriptions of the circuit structure will be made based on the red pixel PX-R and details of other pixels will be omitted. In addition, FIG. 6A shows an equivalent circuit diagram of one sensor FX of the sensors FX shown in FIG. 3. Since the sensors FX may have substantially the same circuit structure as one another, the circuit structure of one sensor FX will be described in detail, and descriptions of other sensors will be omitted.

Referring to FIG. 6A, the red pixel PX-R may be connected to an i-th data line DLi, a j-th initialization scan line SILj, a j-th compensation scan line SCLj, a j-th write scan line SWLj, a j-th black scan line SBLj, and a j-th light emission control line EMLj.

The pixel driving circuit R_PD may include first, second, third, fourth, and fifth transistors T1, T2, T3, T4, and T5, first and second light emission control transistors ET1 and ET2, and one capacitor Cst. At least one of the first to fifth transistors T1 to T5 and the first and second light emission control transistors ET1 and ET2 may be a transistor including a low-temperature polycrystalline silicon (LTPS) semiconductor layer. Some transistors of the first to fifth transistors T1 to T5 and the first and second light emission control transistors ET1 and ET2 may be a P-type transistor, and the other transistors may be an N-type transistor. As an example, each of the first, second, and fifth transistors T1, T2, and T5 and the first and second light emission control transistors ET1 and ET2 may be a PMOS transistor, and each of the third and fourth transistors T3 and T4 may be an NMOS transistor. Hereinafter, a source, a drain, and a gate of the first, second, and fifth transistors T1, T2, and T5 and the first and second light emission control transistors ET1 and ET2 will be described based on the PMOS transistor, and a source, a drain, and a gate of the third and fourth transistors T3 and T4 will be described based on the NMOS transistor.

For example, at least one of the first to fifth transistors T1 to T5 and the first and second light emission control transistors ET1 and ET2 may be a transistor including at least one oxide semiconductor layer. As an example, each of the third and fourth transistors T3 and T4 may be an oxide semiconductor transistor, and each of the first, second, and fifth transistors T1, T2, and T5 and each of the first and second light emission control transistors ET1 and ET2 may be a silicon transistor.

The circuit structure of the pixel driving circuit R_PD should not be limited to the embodiment shown in FIG. 6A. The pixel driving circuit R_PD shown in FIG. 6A is merely an example, and the circuit structure of the red pixel driving circuit R_PD may be changed. As an example, all the first to fifth transistors T1 to T5 and the first and second light emission control transistors ET1 and ET2 may be the P-type transistor or the N-type transistor.

The j-th initialization scan line SILj, the j-th compensation scan line SCLj, the j-th write scan line SWLj, the j-th black scan line SBLj, and the j-th light emission control line EMLj may respectively transmit a j-th initialization scan signal SIj, a j-th compensation scan signal SCj, a j-th write scan signal SWj, a j-th black scan signal SBj, and a j-th light emission control signal EMj to the red pixel PX-R. The i-th data line DLi may transmit an i-th data signal Di to the red pixel PX-R. The i-th data signal Di may have a voltage level corresponding to the image signal RGB (refer to FIG. 3) input to the display device DD (refer to FIG. 3).

First and second driving voltage lines VL1 and VL2 may respectively transmit the first driving voltage ELVDD and the second driving voltage ELVSS to the red pixel PX-R. In addition, first and second initialization voltage lines VL3 and VL4 may respectively transmit the first initialization voltage VINT1 and the second initialization voltage VINT2 to the red pixel PX-R.

The first transistor T1 may be connected between the first driving voltage line VL1, to which the first driving voltage ELVDD is applied, and the red light emitting element ED_R. The first transistor T1 may include the source connected to the first driving voltage line VL1 through the first light emission control transistor ET1, the drain connected to the first electrode R_AE (refer to FIG. 5A) of the red light emitting element ED_R through the second light emission control transistor ET2, and the gate connected to one end of the capacitor Cst, e.g., a first node N1. The first transistor T1 may receive the i-th data signal Di via the i-th data line DLi according to a switching operation of the second transistor T2 and may supply a driving current Id to the red light emitting element ED_R.

The second transistor T2 may be connected between the data line DLi and the source of the first transistor T1. The second transistor T2 may include the source connected to the data line DLi, the drain connected to the source of the first transistor T1, and the gate connected to the j-th write scan line SWLj. The second transistor T2 may be turned on in response to the write scan signal SWj applied thereto through the j-th write scan line SWLj and may transmit the i-th data signal Di provided from the i-th data line DLi to the source of the first transistor T1.

The third transistor T3 may be connected between the drain of the first transistor T1 and the first node N1. The third transistor T3 may include the source connected to the gate of the first transistor T1, the drain connected to the drain of the first transistor T1, and the gate connected to the j-th compensation scan line SCLj. The third transistor T3 may be turned on in response to the j-th compensation scan signal SCj applied thereto through the j-th compensation scan line SCLj and may connect the drain and the gate of the first transistor T1 to each other, and thus, the first transistor T1 may be connected in a diode configuration.

The fourth transistor T4 may be connected between the first initialization voltage line VL3, to which the first initialization voltage VINT1 is applied, and the first node N1. The fourth transistor T4 may include the source connected to the first initialization voltage line VL3 transmitting the first initialization voltage VINT1, the drain connected to the first node N1, and the gate connected to the j-th initialization scan line SILj. The fourth transistor T4 may be turned on in response to the j-th initialization scan signal SIj applied thereto through the j-th initialization scan line SILj. The turned-on fourth transistor T4 may supply the first initialization voltage VINT1 to the first node N1 to initialize an electric potential of the gate of the first transistor T1, i.e., an electric potential of the first node N1.

The first light emission control transistor ET1 may include the source connected to the first driving voltage line VL1, the drain connected to the source of the first transistor T1, and the gate connected to the j-th light emission control line EMLj. The second light emission control transistor ET2 may include the source connected to the drain of the first transistor T1, the drain connected to the first electrode R_AE (refer to FIG. 5A) of the red light emitting element ED_R, and the gate connected to the j-th light emission control line EMLj. The first and the second light emission control transistors ET1 and ET2 may be turned on at substantially at the same time in response to the j-th light emission control signal EMj applied thereto through the j-th light emission control line EMLj. The first driving voltage ELVDD provided through the turned-on first light emission control transistor ET1 may be compensated for by the first transistor T1 in the diode configuration and then may be supplied to the red light emitting element ED_R.

The fifth transistor T5 may include the drain connected to the second initialization voltage line VL4, to which the second initialization voltage VINT2, is applied, the source connected to the drain of the second light emission control transistor ET2, and the gate connected to the j-th black scan line SBLj. The second initialization voltage VINT2 may have a voltage level equal to or lower than that of the first initialization voltage VINT1.

As described above, the one end of the capacitor Cst may be connected to the gate of the first transistor T1, and the other end of the capacitor Cst may be connected to the first driving voltage line VL1. A second electrode (or, e.g., a cathode) of the red light emitting element ED_R may be connected to the second driving voltage line VL2 that transmits the second driving voltage ELVSS. The second driving voltage ELVSS may have a voltage level lower than that of the first driving voltage ELVDD. As an example, the second driving voltage ELVSS may have a voltage level lower than that of each of the first and second initialization voltages VINT1 and VINT2.

Referring to FIGS. 6A and 6B, the j-th light emission control signal EMj may have a high level during a non-light-emitting period NEP. The j-th initialization scan signal SIj may be activated within the non-light-emitting period NEP. When the j-th initialization scan signal SIj having the high level is provided through the j-th initialization scan line SILj during an activation period AP1 (hereinafter, referred to as a first activation period) of the j-th initialization scan signal SIj, the fourth transistor T4 may be turned on in response to the j-th initialization scan signal SIj having the high level. The first initialization voltage VINT1 may be applied to the gate of the first transistor T1 through the turned-on fourth transistor T4, and the first node N1 may be initialized to the first initialization voltage VINT1. Accordingly, the first activation period AP1 may be an initialization period of the red pixel PX-R.

Then, when the j-th compensation scan signal SCj is activated and the j-th compensation scan signal SCj having the high level is provided through the j-th compensation scan line SCLj during an activation period AP2 (hereinafter, referred to as a second activation period) of the j-th compensation scan signal SCj, the third transistor T3 may be turned on. The first transistor T1 may be connected in the diode configuration by the third transistor T3 and may be forward biased. The first activation period AP1 might not overlap the second activation period AP2.

The j-th write scan signal SWj may be activated within the second activation period AP2. The j-th write scan signal SWj may have a low level during an activation period AP4 (hereinafter, referred to as a fourth activation period). The second transistor T2 may be turned on in response to the j-th write scan signal SWj having the low level during the fourth activation period AP4. Then, a compensation voltage "Di-Vth", which is reduced by a threshold voltage Vth of the first transistor T1, from the i-th data signal Di, which is provided through the i-th data line DLi, may be applied to the gate of the first transistor T1. That is, an electric potential of the gate of the first transistor T1 may be the compensation voltage "Di-Vth". The fourth activation period AP4 may overlap the second activation period AP2. A duration of the second activation period AP2 may be greater than a duration of the fourth activation period AP4.

The first driving voltage ELVDD and the compensation voltage "Di-Vth" may be respectively applied to both ends of the capacitor Cst, and the capacitor Cst may be charged with electric charges corresponding to a difference in voltage between both ends of the capacitor Cst. A high level period of the j-th compensation scan signal SCj may be referred to as a compensation period of the red pixel PX-R.

In addition, the j-th black scan signal SBj may be activated within the second activation period AP2 of the j-th compensation scan signal SCj. The j-th black scan signal SBj may have the low level during an activation period AP3 (hereinafter, referred to as a third activation period). During the third activation period AP3, the fifth transistor T5 may be turned on in response to the j-th black scan signal SBj having the low level applied thereto through the j-th black scan line SBLj. A portion of the driving current Id may be bypassed as a bypass current Ibp via the fifth transistor T5. The third activation period AP3 may overlap the second activation period AP2. The duration of the second activation period AP2 may be greater than a duration of the third activation period AP3. The third activation period AP3 may precede the fourth activation period AP4 and might not overlap the fourth activation period AP4.

In a case where the red pixel PX-R displays a black image, when the red light emitting element ED_R emits a light even though a minimum driving current of the first transistor T1 flows as the driving current Id, the red pixel PX-R might not properly display the black image. Therefore, the fifth transistor T5 of the red pixel PX-R according to the embodiment of the present invention may distribute a portion of the minimum driving current of the first transistor T1 to another current path as the bypass current Ibp rather than a current path to the red light emitting element ED_R. In this case, the minimum driving current of the first transistor T1 may be a current flowing to the first transistor T1 under a condition that a gate-source voltage Vgs of the first transistor T1 is less than the threshold voltage Vth and the first transistor T1 is turned off. In this way, when the minimum driving current that is flowing to the first transistor T1 under the condition that the first transistor T1 is turned off, for example, a current of less than about 10 pA, is transmitted to the red light emitting element ED_R, an image with a black grayscale may be displayed. In the case where the red pixel PX-R displays the black image, an influence of the bypass current Ibp with respect to the minimum driving current is relatively large, however, in the case where images, such as a normal image or a white image, are displayed, the influence of the bypass current Ibp with respect to the driving current Id may be negligible. Accordingly, when the black image is displayed, a current, i.e., a light emitting current led, that is reduced by an amount of the bypass current Ibp, which is bypassed through the fifth transistor T5, from the driving current Id may be provided to the red light emitting element ED_R, and thus, the black image may be clearly displayed. Thus, the red pixel PX-R may display an accurate black grayscale image using the fifth transistor T5, and as a result, a contrast ratio may be improved.

In addition, a level of the j-th light emission control signal EMj provided from the j-th light emission control line EMLj may be changed to the low level from the high level. The first and second light emission control transistors ET1 and ET2 may be turned on in response to the j-th light emission control signal EMj having the low level. As a result, the driving current Id may be generated due to a difference in voltage between the voltage of the gate of the first transistor T1 and the first driving voltage ELVDD. In addition, the driving current Id may be supplied to the red light emitting element ED_R via the second light emission control transistor ET2, and thus, the light emitting current led may flow through the red light emitting element ED_R.

Referring to FIG. 6A again, the sensor FX may be connected to a d-th read-out line RLd among the read-out lines RL1 to RLh, the j-th write scan line SWLj, and the reset control line RCL.

The sensor FX may include at least one optical sensing element, for example, OPD1 and OPD2, and the sensor driving circuit O_SD. Two optical sensing elements OPD1 and OPD2 connected to each other in parallel are shown as a representative example. The first and second optical sensing elements OPD1 and OPD2 may be connected to a first sensing node SN1, and second electrodes of the first and second optical sensing elements OPD1 and OPD2 may be connected to the second driving voltage line VL2 transmitting the second driving voltage ELVSS.

The sensor driving circuit O_SD may include three transistors ST1, ST2, and ST3. The three transistors ST1 to ST3 may be a reset transistor ST1, an amplification transistor ST2, and an output transistor ST3, respectively. At least one of the reset transistor ST1, the amplification transistor ST2, and/or the output transistor ST3 may be an oxide semiconductor transistor. As an example, the reset transistor ST1 may be the oxide semiconductor transistor, and the amplification transistor ST2 and the output transistor ST3 may be the silicon transistor, however, the present invention should not be limited thereto or thereby. According to an embodiment of the present invention, at least the reset transistor ST1 and the output transistor ST3 may be the oxide semiconductor transistor, and the amplification transistor ST2 may be the silicon transistor.

In addition, at least one of the reset transistor ST1, the amplification transistor ST2, and/or the output transistor ST3 may be the P-type transistor, and the other transistors may be the N-type transistor, if any. As an example, the amplification transistor ST2 and the output transistor ST3 may be the PMOS transistors, and the reset transistor ST1 may be the NMOS transistor, however, the present invention should not be limited thereto or thereby. According to an embodiment of the present invention, all the reset transistor ST1, the amplification transistor ST2, and the output transistor ST3 may be the N-type transistor or the P-type transistor. Hereinafter, a source, a drain, and a gate of the amplification transistor ST2 and the output transistor ST3 will be described based on the PMOS transistor, and a source, a drain, and a gate of the reset transistor ST1 will be described based on the NMOS transistor.

For example, among the reset transistor ST1, the amplification transistor ST2, and the output transistor ST3, the reset transistor ST1 may be the same type of transistor as the third and fourth transistors T3 and T4 of the red pixel PX-R. As another example, the amplification transistor ST2 and the output transistor ST3 may be the same type of transistor as the first, second, and fifth transistors T1, T2, and T5 and the first and second light emission control transistors ET1 and ET2 of the red pixel PX-R.

The circuit structure of the sensor driving circuit O_SD should not be limited to that shown in FIG. 6A. The sensor driving circuit O_SD shown in FIG. 6A is merely an example, and the circuit structure of the sensor driving circuit O_SD may be changed in various ways.

The reset transistor ST1 may include the source receiving a reset voltage Vrst, the drain connected to the first sensing node SN1, and the gate receiving a reset control signal RST. The reset transistor ST1 may reset an electric potential of the first sensing node SN1 to the reset voltage Vrst in response to the reset control signal RST. The reset control signal RST may be a signal provided through the reset control line RCL, however, the present invention should not be limited thereto or thereby. In addition, the reset control signal RST may be the j-th compensation scan signal SCj provided through the j-th compensation scan line SCLj. For example, the reset transistor ST1 may receive the j-th compensation scan signal SCj, which is provided through the j-th compensation scan line SCLj, as the reset control signal RST. As an example, the reset voltage Vrst may have a voltage level lower than that of the second driving voltage ELVSS at least during an activation period of the reset control signal RST. The reset voltage Vrst may be a DC voltage maintained at a voltage level lower than that of the second driving voltage ELVSS.

The amplification transistor ST2 may include the source receiving a sensing driving voltage SLVD, the drain connected to a second sensing node SN2, and the gate connected to the first sensing node SN1. The amplification transistor ST2 may be turned on depending on the electric potential of the first sensing node SN1 and may apply the sensing driving voltage SLVD to the second sensing node SN2. As an example, the sensing driving voltage SLVD may be one of the first driving voltage ELVDD and the first and second initialization voltages VINT1 and VINT2. When the sensing driving voltage SLVD is the first driving voltage ELVDD, the source of the amplification transistor ST2 may be electrically connected to the first driving voltage line VL1. When the sensing driving voltage SLVD is the first initialization voltage VINT1, the source of the amplification transistor ST2 may be electrically connected to the first initialization voltage line VL3, and when the sensing driving voltage SLVD is the second initialization voltage VINT2, the source of the amplification transistor ST2 may be electrically connected to the second initialization voltage line VIA.

The output transistor ST3 may include the source connected to the second sensing node SN2, the drain connected to the d-th read-out line RLd, and the gate receiving an output control signal through the j-th write scan line SWj. The output transistor ST3 may apply a sensing signal FSd to the d-th read-out line RLd in response to the output control signal. The output control signal may be the j-th write scan signal SWj provided through the j-th write scan line SWLj. For example, the output transistor ST3 may receive the j-th write scan signal SWj, which is provided through the j-th write scan line SWLj, as the output control signal.

The first and second optical sensing elements OPD1 and OPD2 of the sensor FX may be exposed to a light during the light emitting period of the light emitting elements ED_R, ED_G1, ED_G2, and ED_B (refer to FIG. 5A). The light may be emitted from at least one of the light emitting elements ED_R, ED_G1, ED_G2, and ED_B.

When the user's finger US_F (refer to FIG. 1) touches the display surface IS (refer to FIG. 1), the optical sensing elements OPD1 and OPD2 may generate photo-charges corresponding to the light reflected by ridges of the user's fingerprint or valleys between the ridges of the user's fingerprint, and the generated photo-charges may be accumulated in the first sensing node SN1. The amplification transistor ST2 may be a source follower amplifier that generates a source-drain current in proportion to an amount of charge of the first sensing node SN1 that is input to the gate of the amplification transistor T2.

During the fourth activation period AP4 (refer to FIG. 6B), the j-th write scan signal SWj having the low level may be applied to the output transistor ST3 via the j-th write scan line SWLj. When the output transistor ST3 is turned on in response to the j-th write scan signal SWj having the low level, a sensing signal FSd corresponding to a current flowing through the amplification transistor ST2 may be output to the d-th read-out line RLd.

When the reset control signal RST having the high level is provided through the reset control line RCL during the reset period RSP (refer to FIG. 5C), the reset transistor ST1 may be turned on. The reset period RSP may be defined as an activation period of the reset control line RCL, i.e., a high level period. In addition, when the reset transistor ST1 is the PMOS transistor, the reset control signal RST having the low level may be applied to the reset control line RCL during the reset period RSP. During the reset period RSP, the first sensing node SN1 may be reset to an electric potential corresponding to the reset voltage Vrst. As an example, the reset voltage Vrst may have a voltage level lower than that of the second driving voltage ELVSS.

Then, when the reset period RSP is finished, the first and second optical sensing elements OPD1 and OPD2 may generate photo-charges corresponding to the light provided thereto, and the generated photo-charges may be accumulated in the first sensing node SN1.

Figure 7:
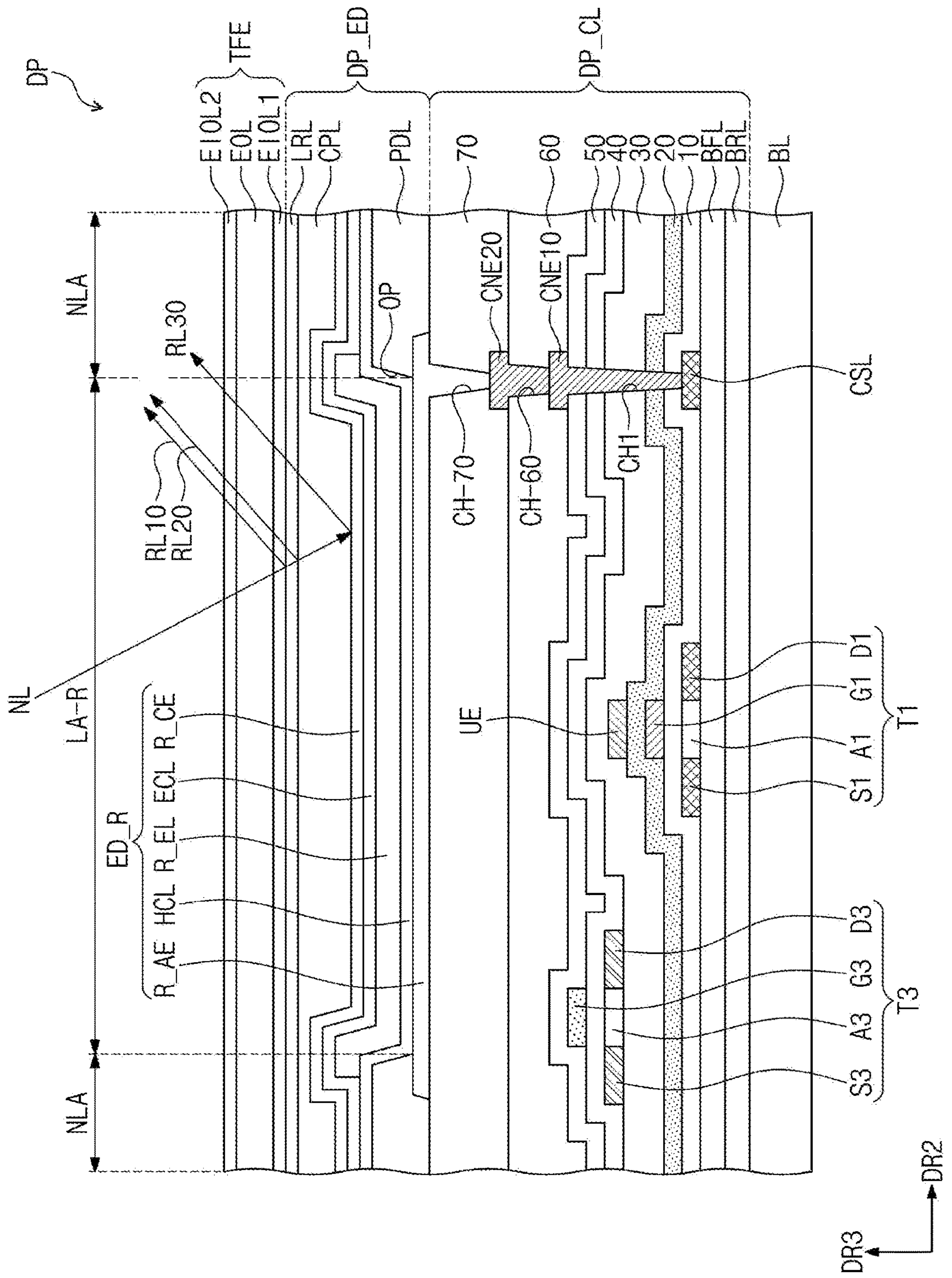
FIG. 7 is a cross-sectional view of a display panel according to an embodiment of the present invention.
Figure 8A:
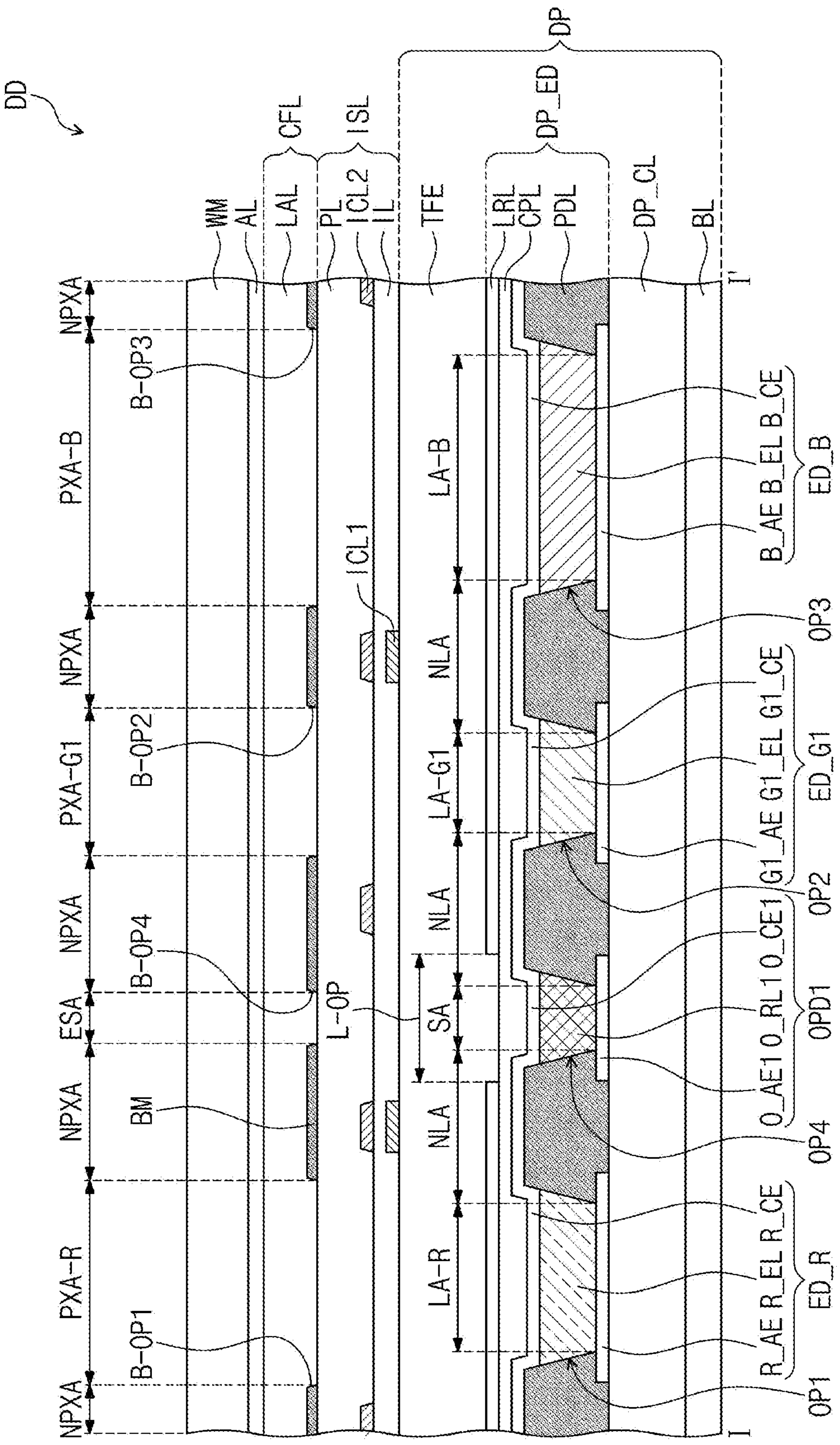
FIGS. 8A, 8B and 8C are cross-sectional views of display devices taken along a line I-I' of FIGS. 4 and 5A.
Figure 8B:
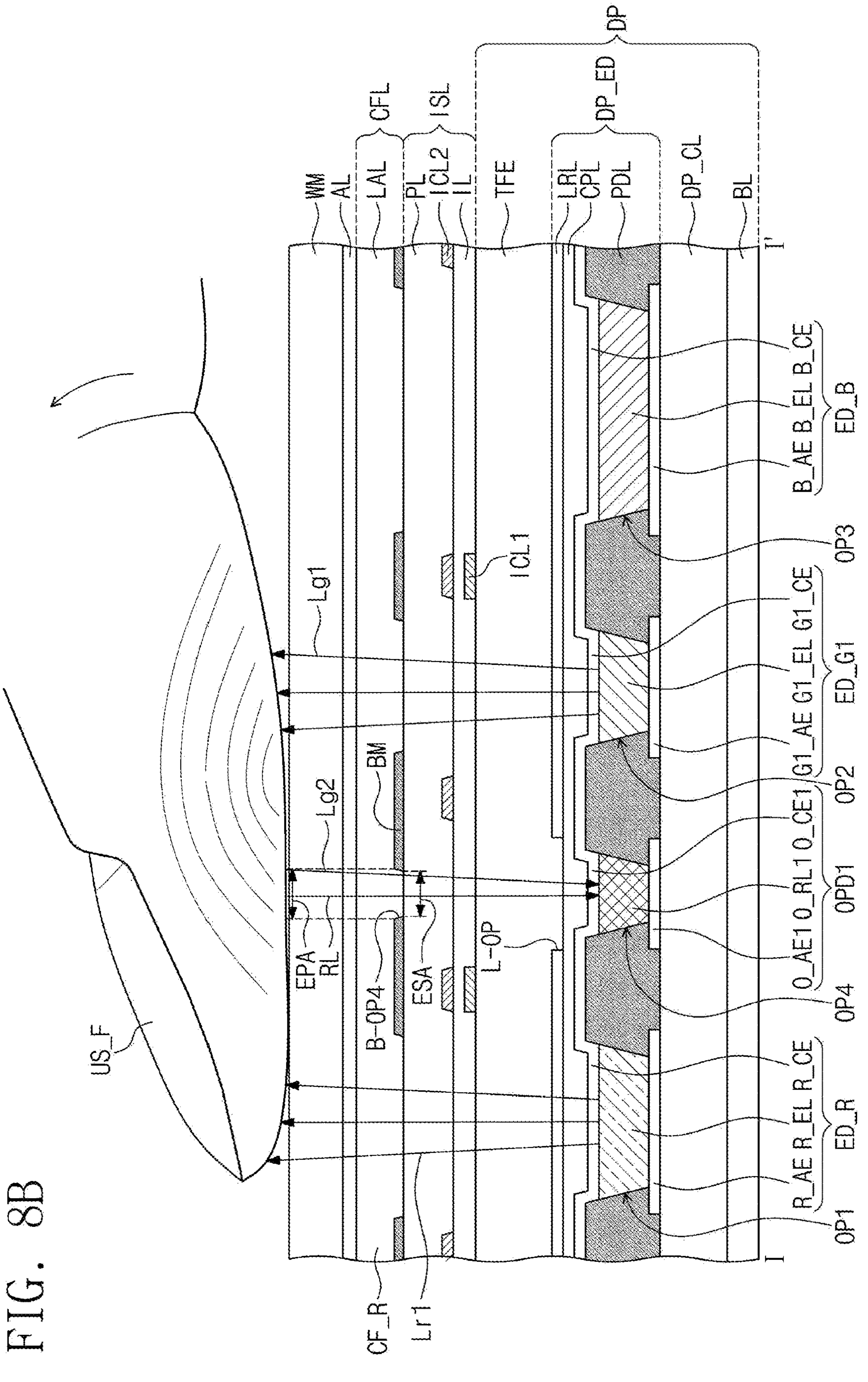
Figure 8C:
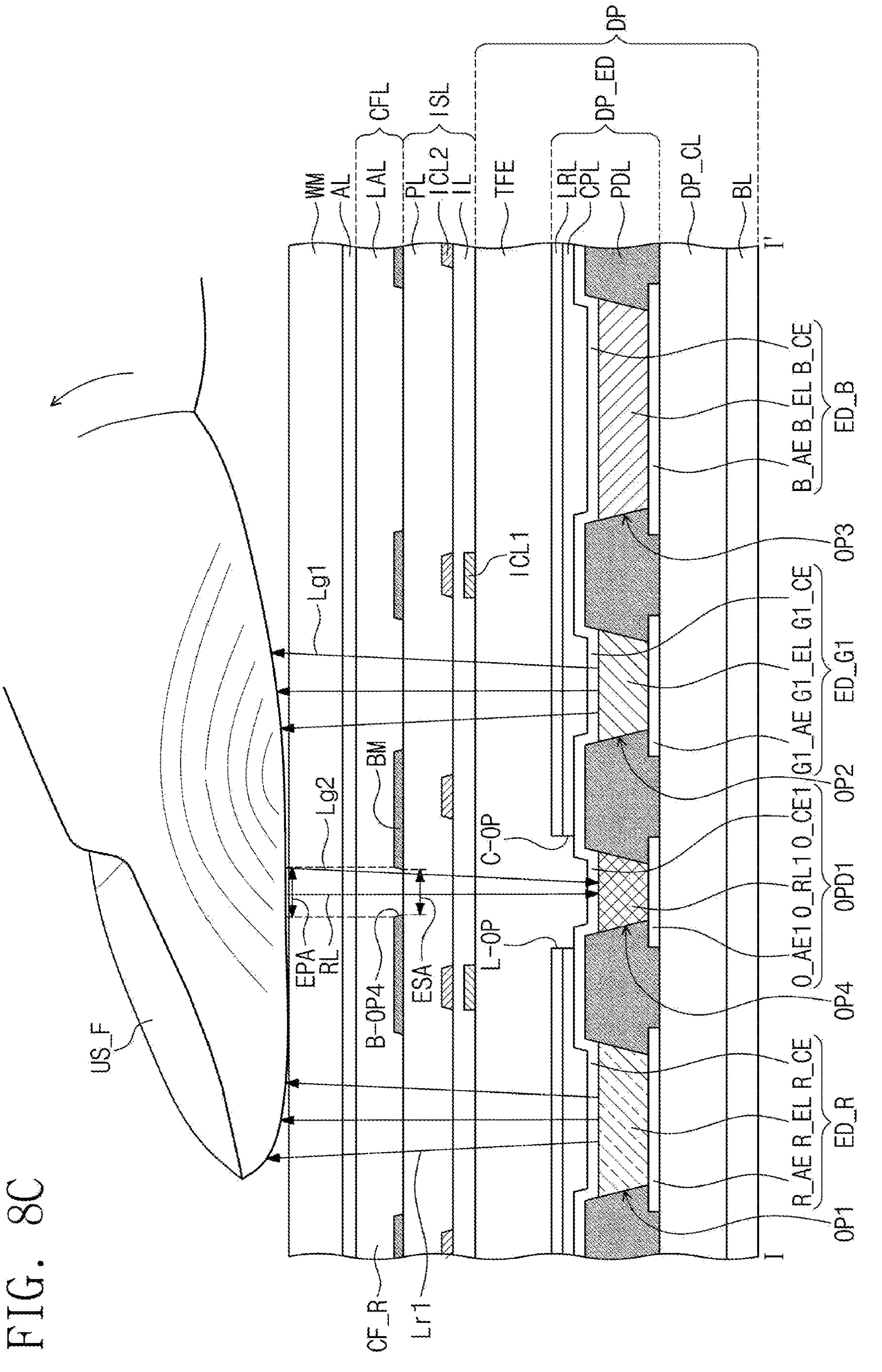
Figure 9:
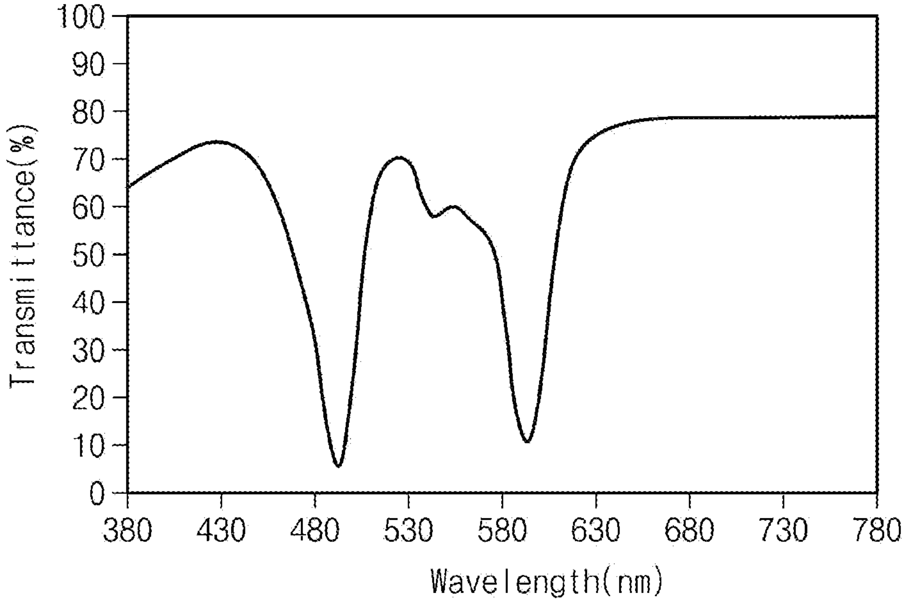
FIG. 9 is a graph of a transmittance of a light absorbing layer as a function of a wavelength.

FIG. 7 is a cross-sectional view of the display panel DP according to an embodiment of the present invention. FIGS. 8A to 8C are cross-sectional views of display devices taken along a line I-I' of FIGS. 4 and 5A. FIG. 9 is a graph of a transmittance of a light absorbing layer LAL as a function of a wavelength.

Referring to FIG. 7, the display panel DP may include the base layer BL, the circuit layer DP_CL, the element layer DP_ED, and the thin film encapsulation layer TFE. The circuit layer DP_CL, the element layer DP_ED, and the thin film encapsulation layer TFE may be disposed on the base layer BL.

The base layer BL may include, for example, a synthetic resin layer. The synthetic resin layer may include a heat-curable resin. For example, the synthetic resin layer may include a polyimide-based resin, however, a material for the synthetic resin layer should not be particularly limited thereto. The synthetic resin layer may include, for example, at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and/or a perylene-based resin. According to an embodiment of the present invention, the base layer BL may include a glass substrate, a metal substrate, or an organic/inorganic composite material substrate.

For example, at least one inorganic layer may be disposed on an upper surface of the base layer BL. The inorganic layer may include, for example, at least one of aluminum oxide, titanium oxide, silicon oxide, silicon nitride, silicon oxynitride, zirconium oxide, and/or hafnium oxide. The inorganic layer may be formed in multiple layers. The inorganic layers may form a barrier layer BRL and/or a buffer layer BFL. According to an embodiment of the present invention, the buffer layer BFL and the barrier layer BRL may be selectively disposed on the base layer BL.

The barrier layer BRL may prevent a foreign substance from entering from the outside. The barrier layer BRL may include, for example, a silicon oxide layer and a silicon nitride layer. According to an embodiment of the present invention, the barrier layer BRL may include silicon oxide layers alternately stacked with silicon nitride layers.

The buffer layer BFL may be disposed on the barrier layer BRL. The buffer layer BFL may increase an adhesion between the base layer BL and a semiconductor pattern or between the base layer BL and a conductive pattern. According to an embodiment of the present invention, the buffer layer BFL may include a silicon oxide layer and a silicon nitride layer. The silicon oxide layer and the silicon nitride layer may be alternately stacked on one another.

The semiconductor pattern may be disposed on the buffer layer BFL. Hereinafter, the semiconductor pattern disposed on the buffer layer BFL is referred to as a first semiconductor pattern. For example, the semiconductor pattern may be directly disposed on the buffer layer BFL. The first semiconductor pattern may include, for example, a silicon semiconductor. The first semiconductor pattern may include, for example, polysilicon, however, it should not be limited thereto or thereby. According to an embodiment of the present invention, the first semiconductor pattern may include amorphous silicon.

FIG. 7 shows only a portion of the first semiconductor pattern, and the first semiconductor pattern may be further disposed in other areas. The first semiconductor pattern may have different electrical properties depending on whether it is doped or not or whether it is doped with an N-type dopant or a P-type dopant. The first semiconductor pattern may include a doped region and a non-doped region. The doped region may be doped with the N-type dopant or the P-type dopant. A P-type transistor may include a doped region doped with the P-type dopant, and an N-type transistor may include a doped region doped with the N-type dopant.

The doped region may have a conductivity greater than that of the non-doped region and may substantially serve as an electrode or signal line. The non-doped region may substantially correspond to a channel area of the transistor. For example, a portion of the first semiconductor pattern may be the channel area of the transistor. In addition, another portion of the first semiconductor pattern may be the source or the drain of the transistor, and the other portion of the first semiconductor pattern may be a connection electrode or a connection signal line.

As shown in FIG. 7, a source S1, a channel area A1, and a drain D1 of the first transistor T1 may be formed from the first semiconductor pattern. The source S1 and the drain D1 may be disposed on opposing sides of the channel area A1.

FIG. 7 shows a portion of a signal transmission area CSL formed from the semiconductor pattern. The signal transmission area CSL may be connected to the drain of the second light emission control transistor ET2 (refer to FIG. 6A) when viewed in a plane.

A first insulating layer 10 may be disposed on the buffer layer BFL. The first insulating layer 10 may commonly overlap the pixels PX (refer to FIG. 3) and may cover the first semiconductor pattern. The first insulating layer 10 may be, for example, an inorganic layer and/or an organic layer and may have a single-layer or multi-layer structure. The first insulating layer 10 may include at least one of, for example, aluminum oxide, titanium oxide, silicon oxide, silicon oxynitride, zirconium oxide, and/or hafnium oxide. In the present embodiment, the first insulating layer 10 may have a single-layer structure of a silicon oxide layer. Not only the first insulating layer 10, but also an insulating layer of the circuit layer DP_CL described later may be an inorganic layer and/or an organic layer and may have a single-layer or multi-layer structure. The inorganic layer may include at least one of the above-mentioned materials, however, it should not be limited thereto or thereby.

A gate G1 of the first transistor T1 may be disposed on the first insulating layer 10. The gate G1 may be a portion of a metal pattern. The gate G1 of the first transistor T1 may overlap the channel area A1 of the first transistor T1. The gate G1 of the first transistor T1 may be used as a mask in a process of doping the first semiconductor pattern.

A second insulating layer 20 may be disposed on the first insulating layer 10 and may cover the gate G1. The second insulating layer 20 may commonly overlap the pixels PX (refer to FIG. 3). The second insulating layer 20 may be, for example, an inorganic layer and/or an organic layer and may have a single-layer or multi-layer structure. In the present embodiment, the second insulating layer 20 may have a single-layer structure of a silicon oxide layer.

An upper electrode UE may be disposed on the second insulating layer 20. The upper electrode UE may overlap the gate G1. The upper electrode UE may be a portion of a metal pattern or a portion of the doped semiconductor pattern. A portion of the gate G1 and the upper electrode UE overlapping the portion of the gate G1 may form the capacitor Cst (refer to FIG. 6A). According to an embodiment of the present invention, the upper electrode UE may be omitted.

According to an embodiment of the present invention, the second insulating layer 20 may be replaced with an insulating pattern. The upper electrode UE may be disposed on the insulating pattern. The upper electrode UE may serve as a mask in the process of forming the insulating pattern from the second insulating layer 20.

A third insulating layer 30 may be disposed on the second insulating layer 20 to cover the upper electrode UE. The third insulating layer 30 may have a single-layer structure of a silicon oxide layer. The semiconductor pattern may be disposed on the third insulating layer 30. Hereinafter, the semiconductor pattern disposed on the third insulating layer 30 is referred to as a second semiconductor pattern. For example, the second semiconductor pattern may be disposed directly on the third insulating layer 30. The second semiconductor pattern may include, for example, metal oxide. The oxide semiconductor may include, for example, a crystalline or amorphous oxide semiconductor. As an example, the oxide semiconductor may include the metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include, for example, indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

FIG. 7 shows only a portion of the second semiconductor pattern, and the second semiconductor pattern may be further disposed in other areas. The second semiconductor pattern may include a plurality of areas distinguished from each other depending on whether the metal oxide is reduced or not. An area (hereinafter, referred to as a reduced area) where the metal oxide is reduced may have a conductivity higher than that of an area (hereinafter, referred to as a non-reduced area) where the metal oxide is not reduced. The reduced area may substantially act as the electrode or the signal line. The non-reduced area may substantially correspond to the channel of the transistor. For example, a portion of the second semiconductor pattern may be the channel area of the transistor, and the other portion of the second semiconductor pattern may be the source or the drain of the transistor.

Referring to FIG. 7, a source S3, a channel area A3, and a drain D3 of the third transistor T3 may be formed from the second semiconductor pattern. The source S3 and the drain D3 may include a metal reduced from a metal oxide semiconductor. The source S3 and the drain D3 may have a predetermined thickness from an upper surface of the second semiconductor pattern and may include a metal layer including the reduced metal.

A fourth insulating layer 40 may be disposed on the third insulating layer 30 and may cover the second semiconductor pattern. In the present embodiment, the fourth insulating layer 40 may have a single-layer structure of a silicon oxide layer. A gate G3 of the third transistor T3 may be disposed on the fourth insulating layer 40. The gate G3 may be a portion of a metal pattern. The gate G3 of the third transistor T3 may overlap the channel area A3 of the third transistor T3.

According to an embodiment of the present invention, the fourth insulating layer 40 may be replaced with an insulating pattern. The gate G3 of the third transistor T3 may be disposed on the insulating pattern. In the present embodiment, the gate G3 may have substantially the same shape as that of the insulating pattern when viewed in a plane; however, the present invention is not limited thereto. For the convenience of explanation, one gate G3 is shown, however, the third transistor T3 may include two gates.

A fifth insulating layer 50 may be disposed on the fourth insulating layer 40 to cover the gate G3. The fifth insulating layer 50 may include a silicon oxide layer and a silicon nitride layer. According to an embodiment of the present invention, the fifth insulating layer 50 may include silicon oxide layers alternately stacked with silicon nitride layers.

The source and the drain of the fourth transistor T4 (refer to FIG. 5A) may be formed through the same process as the source S3 and the drain D3 of the third transistor T3. In addition, the source and the drain of the reset transistor ST1 (refer to FIG. 5A) of the sensor FX (refer to FIG. 5A) and the source and the drain of the output transistor ST3 (refer to FIG. 5A) may be formed substantially at the same time through the same process as the source S3 and the drain D3 of the third transistor T3.

At least one insulating layer may be disposed on the fifth insulating layer 50. A sixth insulating layer 60 and a seventh insulating layer 70 may be disposed on the fifth insulating layer 50. Each of the sixth insulating layer 60 and the seventh insulating layer 70 may be, for example, an organic layer and may have a single-layer or multi-layer structure. For example, each of the sixth insulating layer 60 and the seventh insulating layer 70 may have a single-layer structure of a polyimide-based resin layer, however, they should not be limited thereto or thereby. According to an embodiment of the present invention, each of the sixth insulating layer 60 and the seventh insulating layer 70 may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

A first connection electrode CNE10 may be disposed on the fifth insulating layer 50. The first connection electrode CNE10 may be connected to the signal transmission area CSL through a first contact hole CHI that penetrates the first to fifth insulating layers 10 to 50, and a second connection electrode CNE20 may be connected to the first connection electrode CNE10 through a contact hole CH-60 that penetrates the sixth insulating layer 60. According to an embodiment of the present invention, at least one of the fifth, sixth, and/or seventh insulating layers 50, 60, and/or 70 may be omitted.

The element layer DP_ED may include the red light emitting element ED_R and a pixel definition layer PDL. The first electrode R_AE of the red light emitting element ED_R may be disposed on the seventh insulating layer 70. The first electrode R_AE of the red light emitting element ED_R may be connected to the second connection electrode CNE20 via a contact hole CH-70 that penetrates the seventh insulating layer 70.

At least a portion of the first electrode R_AE of the red light emitting element ED_R may be exposed through an opening OP of the pixel definition layer PDL. The opening OP of the pixel definition layer PDL may define the red light emitting area LA-R. The red light emitting area LA-R may correspond to the exposed portion of the first electrode R_AE, and a non-light-emitting area NLA may be adjacent to the red light emitting area LA-R.

A hole control layer HCL may be commonly disposed on a light emitting area LA and the non-light-emitting area NLA. A common layer such as the hole control layer HCL may be commonly formed in the pixels PX. The hole control layer HCL may include a hole transport layer and a hole injection layer.

The red light emitting layer R_EL may be disposed on the hole control layer HCL. The red light emitting layer R_EL may be disposed only in an area corresponding to the opening OP. The red light emitting layer R_EL may be formed in each of the pixels PX after being divided into plural portions.

In the present embodiment, a patterned red light emitting layer R_EL is shown as a representative example, however, the present invention should not be limited thereto or thereby. A common light emitting layer may be commonly disposed in the pixels PX. In this case, the common light emitting layer may generate a white light or a blue light.

An electron control layer ECL may be disposed on the red light emitting layer R_EL. The electron control layer ECL may include an electron transport layer and an electron injection layer. The second electrode R_CE of the red light emitting element ED_R may be disposed on the electron control layer ECL. The electron control layer ECL and the second electrode R_CE may be commonly disposed in the pixels PX. According to an embodiment of the present invention, the stacked structure of the red light emitting element ED_R may have a structure that is vertically inverted (e.g., upside down) when compared with the structure shown in FIG. 7.

The element layer DP_ED may further include a capping layer CPL and a low reflective inorganic layer LRL. The capping layer CPL may prevent the second electrode R_CE from being damaged during the subsequent process, e.g., a plasma process. The capping layer CPL may include at least one of, for example, an inorganic layer and/or an organic layer.

The capping layer CPL, which is the organic layer, may include, for example, α-NPD, NPB, TPD, m-MTDATA, Alq3, CuPc, TPD15(N4,N4,N4',N4'-tetra (biphenyl-4-yl) biphenyl-4,4'-diamine), TCTA(4,4',4"-Tris(carbazol sol-9-yl) triphenylamine), or the like or may include an epoxy resin or an acrylate resin, such as methacrylate, however, the present invention should not be limited thereto or thereby. According to an embodiment of the present invention, the capping layer CPL may include at least one compound among the following compounds P1 to P5.

P1

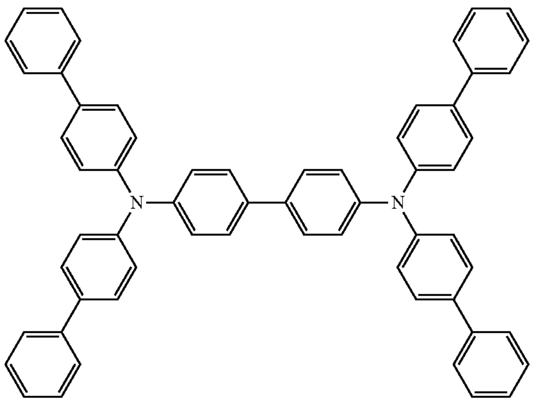

P2

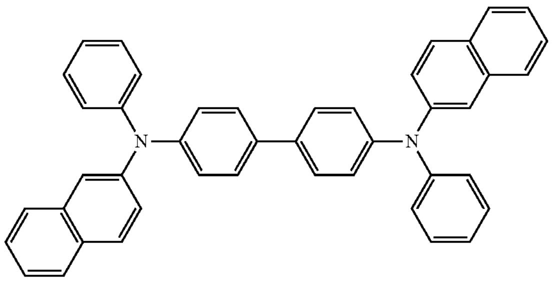

P3

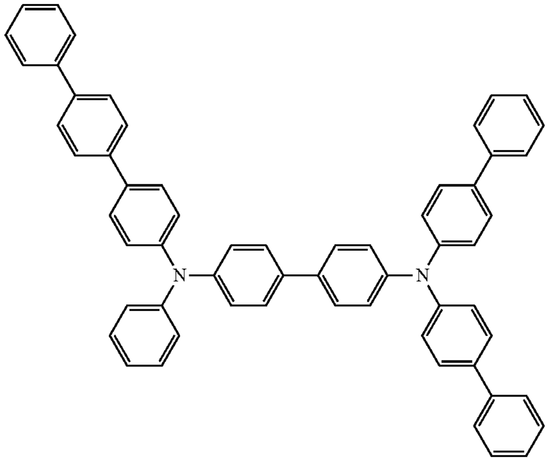

P4

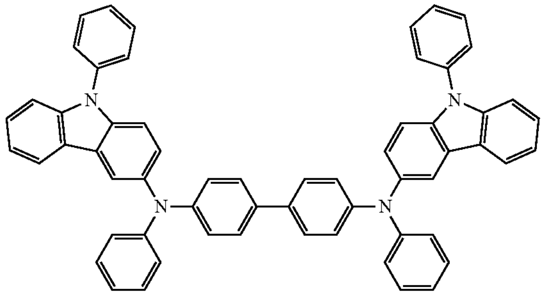

-continued

P5

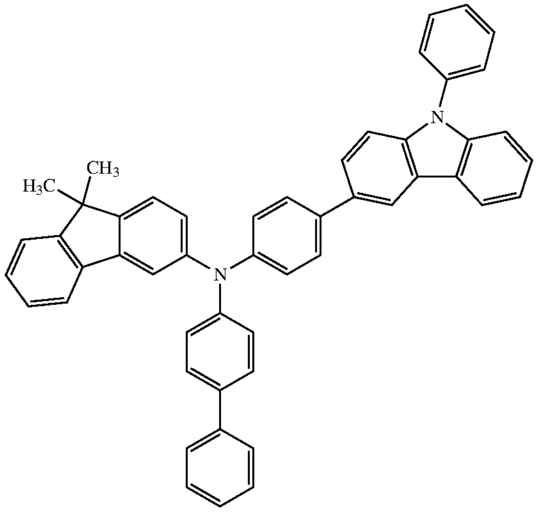

In addition, the capping layer CPL which is the organic layer may have a refractive index equal to or greater than about 1.5. The capping layer CPL, which is the organic layer, may have the refractive index within a range from about 1.5 to about 2.2. For example, the capping layer CPL, which is the organic layer, may have the refractive index equal to or greater than about 1.5 with respect to a light having a wavelength range equal to or greater than about 550 nm and equal to or smaller than about 660 nm.

The capping layer CPL, which is the inorganic layer, may include, for example, an alkali metal compound, such as LiF, an alkaline earth metal compound, such as MgF2, SiON, SiNx, SiOy, or the like. The capping layer CPL may include the organic layer and the inorganic layer disposed on the organic layer.

The low reflective inorganic layer LRL may be disposed on the capping layer CPL. The low reflective inorganic layer LRL may reduce a reflection of the external light in the display panel DP. A natural light NL incident into the display panel DP may be reflected by the low reflective inorganic layer LRL, may be reflected by the capping layer CPL, and may be reflected by the second electrode R_CE. The light reflected by the low reflective inorganic layer LRL may be referred to as a first reflected light RL10. The light reflected by the capping layer CPL may be referred to as a second reflected light RL20, and the light reflected by the second electrode R_CE may be referred to as a third reflected light RL30.

In a case where a thickness of the capping layer CPL and a thickness of the low reflective inorganic layer LRL are set to satisfy the following Equation 1, the third reflected light RL30 may be destructively interfered with at least one of the first reflected light RL10 and the second reflected light RL20.

$$T1+T2=\left\{\frac{\lambda}{4}\times\frac{1}{n1}\right\}+\left\{\frac{\lambda}{4}\times\frac{1}{n2}\right\} \quad \text{Equation 1}$$

In Equation 1, λ denotes a wavelength of a visible light, T1 denotes the thickness of the capping layer CPL, T2 denotes the thickness of the low reflective inorganic layer LRL, n1 denotes a refractive index of the capping layer CPL at the λ wavelength, and n2 denotes a refractive index of the low reflective inorganic layer LRL at the λ wavelength. The λ wavelength may be set to a wavelength that is well-perceived by the user's eyes among the wavelengths of visible light. For example, the λ wavelength may be a wavelength that is within the visible light wavelength range of the electromagnetic spectrum. The thickness and the refractive index of the capping layer CPL and the thickness and the refractive index of the low reflective inorganic layer LRL may be determined according to a desired wavelength.

Equation 1 is set under an assumption that a phase difference between the first reflected light RL10 and the second reflected light RL20 with respect to the third reflected light RL30 is about 180 degrees as a condition to generate an extinctive interference. It is desirable that the phase difference between the first reflected light RL10 and the second reflected light RL20 with respect to the third reflected light RL30 is around about 180 degrees, for example, about 160 degrees to about 200 degrees, to effectively cause the destructive interference between the third reflected light RL30 and at least one of the first reflected light RL10 and/or the second reflected light RL20 even though they are not completely cancelled out. For example, T1 and T2 may have a value in a wider range than that satisfying Equation 1.

The low reflective inorganic layer LRL may include bismuth, however, the present invention should not be limited thereto or thereby. It is sufficient that the low reflective inorganic layer LRL includes an inorganic material to form the inorganic layer having the refractive index and the thickness, which satisfy Equation 1.

The low reflective inorganic layer LRL may include an inorganic material having a refractive index equal to or greater than about 1.0 and a light absorption coefficient equal to or greater than about 0.5. The low reflective inorganic layer LRL may be formed by a thermal deposition process and may include an inorganic material having a melting point equal to or smaller than about 1000° C. The low reflective inorganic layer LRL may include, for example, at least one of, for example, bismuth (Bi) and/or ytterbium (Yb). A material for the low reflective inorganic layer LRL may include, for example, bismuth (Bi), ytterbium (Yb), or a compound ($Yb_xBi_y$) of Yb and Bi.

The thin film encapsulation layer TFE may be disposed on the low reflective inorganic layer LRL. The thin film encapsulation layer TFE may cover plural pixels PX. The thin film encapsulation layer TFE may include a first encapsulation inorganic layer EIOL1, an encapsulation organic layer EOL, and a second encapsulation inorganic layer EIOL2, which are sequentially stacked on each other. The first encapsulation inorganic layer EIOL1 and the second encapsulation inorganic layer EIOL2 may include an inorganic material and may protect the element layer DP_ED from, for example, moisture and oxygen. The first encapsulation inorganic layer EIOL1 and the second encapsulation inorganic layer EIOL2 may include, for example, a silicon nitride layer, a silicon oxynitride layer, a silicon oxide layer, a titanium oxide layer, and/or an aluminum oxide layer, however, the present invention should not be particularly limited thereto. The encapsulation organic layer EOL may include, for example, an acrylic-based organic material and may protect the element layer DP_ED from a foreign substance such as dust particles.

In FIGS. 8A to 8C, the circuit layer DP_CL is simply illustrated for clarity, but the circuit layer DP_CL is the same as that described with reference to FIG. 7. Referring to FIGS. 8A to 8C, first, second, and third openings OP1, OP2, and OP3 of the pixel definition layer PDL may respectively expose portions of the first electrodes R_AE, G_AE1, and B_AE of the red, green, blue light emitting elements ED_R, ED_G1, and ED_B. In addition, a fourth opening OP4 of the pixel definition layer PDL may expose at least a portion of the first electrode O_AE1 of the first optical sensing element OPD1. The exposed portion of the first electrode O_AE1 through the fourth opening OP4 may be defined as the sensing area SA.

According to an embodiment of the present invention, the pixel definition layer PDL may further include a black material. The pixel definition layer PDL may further include a black organic dye/pigment, such as a carbon black or an aniline black. The pixel definition layer PDL may be formed by mixing a blue organic material with a black organic material. The pixel definition layer PDL may further include a liquid-repellent organic material.

As shown in FIG. 8A, the non-light-emitting area NLA may be adjacent to the red, green, and blue light emitting areas LA-R, LA-G1, and LA-B and the sensing area SA. The red, green, and blue light emitting layers R_EL, G1_EL, and B_EL may be respectively disposed on the first electrodes R_AE, G_AE1, and B_AE of the red, green, and blue light emitting elements ED_R, ED_G1, and ED_B. In the present embodiment, the patterned red, green, and blue light emitting layers R_EL, G1_EL, and B_EL are shown as a representative example, however, one light emitting layer may be commonly disposed in the red, green and blue light emitting areas LA-R, LA-G1, and LA-B and the non-light-emitting area NLA. In this case, the light emitting layer may generate a white light or a blue light. In addition, the light emitting layer may have a multi-layer structure that is called a tandem.

Each of the red, green, and blue light emitting layers R_EL, G1_EL, and B_EL may include a low molecular weight organic material or a high molecular weight organic material as the light emitting material. According to an embodiment of the present invention, each of the red, green, and blue light emitting layers R_EL, G1_EL, and B_EL may include a quantum dot as the light emitting material. A core of the quantum dot may be selected from a group II-VI compound, a group III-V compound, a group IV-VI compound, a group IV element, a group IV compound, and combinations thereof.

The photoelectric conversion layer O_RL1 may be disposed on the first electrode O_AE1 of the first optical sensing element OPD1. The photoelectric conversion layer O_RL1 may include, for example, an organic photo-sensing material, e.g., a photosensitive semiconductor material. A second electrode layer may be commonly disposed on the red, green, and blue light emitting layers R_EL, G1_EL, and B_EL and the photoelectric conversion layer O_RL1. The second electrode layer may include second electrodes R_CE, G_CE1, and B_CE of the red, green, and blue light emitting elements ED_R, ED_G1, and ED_B and a second electrode O_CE1 of the first optical sensing element OPD1.

Accordingly, a predetermined electric field may be formed between the first and second electrodes O_AE1 and O_CE1 of the first optical sensing element OPD1. The photoelectric conversion layer O_RL1 may generate an electrical signal corresponding to a light incident thereto. The photoelectric conversion layer O_RL1 may absorb an energy of the light incident thereto and may generate electric charges.

The electric charges generated by the photoelectric conversion layer O_RL1 may cause a change of the electric field formed between the first electrode O_AE1 and the second electrode O_CE1. An amount of the electric charges generated by the photoelectric conversion layer O_RL1 may be changed depending on whether the light is incident into the first optical sensing element OPD1 and the amount and the intensity of the light incident into the first optical sensing element OPD1. Accordingly, the electric field formed between the first electrode O_AE1 and the second electrode O_CE1 may be changed. The first optical sensing element OPD1 according to an embodiment of the present invention may obtain fingerprint information of the user based on the change in the electric field between the first electrode O_AE1 and the second electrode O_CE1.

The capping layer CPL and the low reflective inorganic layer LRL may be disposed on the second electrode layer. According to the present embodiment, the capping layer CPL may overlap the red, green, and blue light emitting areas LA-R, LA-G1, and LA-B, the sensing area SA, and the non-light-emitting area NLA.

The low reflective inorganic layer LRL may be disposed on the capping layer CPL and may overlap the red, green, and blue light emitting areas LA-R, LA-G1, and LA-B and the non-light-emitting area NLA. The low reflective inorganic layer LRL may be provided with an opening L-OP that corresponds to the sensing area SA. For example, the opening L-OP overlaps the sensing area SA. The opening L-OP may have a size greater than that of the sensing area SA.

The thin film encapsulation layer TFE may be disposed on the element layer DP_ED, and may be disposed on the capping layer CPL via the opening L-OP. For example, a layer disposed at a lowermost position of the thin film encapsulation layer TFE, i.e., the first encapsulation inorganic layer EIOL1 shown in FIG. 7, may be in contact with the capping layer CPL via the opening L-OP.

The input sensor ISL may be disposed on the thin film encapsulation layer TFE. For example, the input sensor ISL may be directly disposed on the thin film encapsulation layer TFE. The input sensor ISL may include a first conductive layer ICL1, a first insulating layer IL, a second conductive layer ICL2, and a second insulating layer PL. The first conductive layer ICL1 may be disposed on the thin film encapsulation layer TFE. For example, the first conductive layer ICL1 may be directly disposed on the thin film encapsulation layer TFE. FIGS. 8A to 8C show a structure in which the first conductive layer ICL1 is disposed directly on the thin film encapsulation layer TFE, however, the present invention should not be limited thereto or thereby. For example, the input sensor ISL may further include a base insulating layer disposed between the first conductive layer ICL1 and the thin film encapsulation layer TFE. In this case, the thin film encapsulation layer TFE may be covered by the base insulating layer, and the first conductive layer ICL1 may be disposed on the base insulating layer. As an example, the base insulating layer may include an inorganic layer.

The first insulating layer IL may cover the first conductive layer ICL1. The first insulating layer IL may include, for example, an inorganic layer. The second conductive layer ICL2 may be disposed on the first insulating layer IL. The first and second conductive layers ICL1 and ICL2 may include a plurality of conductive patterns. Hereinafter, the first conductive layer ICL1 is referred to as first conductive patterns, and the second conductive layer ICL2 is referred to as second conductive patterns. The first conductive patterns ICL1 and the second conductive patterns ICL2 may form the sensing electrode. This will be described in detail later.

In the present embodiment, the input sensor ISL may include the first and second conductive layers ICL1 and ICL2, however, the present invention should not be limited thereto or thereby. According to an embodiment of the present invention, the input sensor ISL may include only one of the first conductive layer ICL1 or the second conductive layer ICL2. The sensing electrode may have a single-layer structure.

The second insulating layer PL may be disposed on the second conductive layer ICL2. The second insulating layer PL may include, for example, an organic insulating material. The second insulating layer PL may protect the first and second conductive layers ICL1 and ICL2 from a foreign substance.

Referring to FIG. 8A, the anti-reflective layer CFL may be disposed on the second insulating layer PL. For example, the anti-reflective layer CFL may be directly disposed on the second insulating layer PL. The anti-reflective layer CFL may include a light blocking pattern BM. The light blocking pattern BM may be disposed on the anti-reflective layer PL and may overlap the non-light-emitting area NLA. The light blocking pattern BM may include a black material. For instance, the light blocking pattern BM may include a black organic dye/pigment, such as a carbon black or an aniline black. The light blocking pattern BM may cover a structure disposed thereunder and may absorb a natural light incident thereto from the outside.

First, second, third, and fourth openings B-OP1, B-OP2, B-OP3, and B-OP4 may be defined through the light blocking pattern BM to respectively correspond to the first, second, third, and fourth openings OP1, OP2, OP3, and OP4 of the pixel definition layer PDL. For example, the first, second, third, and fourth openings B-OP1, B-OP2, B-OP3, and B-OP4 may respectively overlap the first, second, third, and fourth openings OP1, OP2, OP3, and OP4 of the pixel definition layer PDL. The first, second, and third openings B-OP1, B-OP2, and B-OP3 of the light blocking pattern BM may define a red pixel area PXA-R, a green pixel area PXA-G1, and a blue pixel area PXA-B, respectively.

An area in which the light blocking pattern BM is disposed may be a non-pixel area NPXA. The light blocking pattern BM may overlap the first and second conductive layers ICL1 and ICL2 in the non-pixel area NPXA.

A red light, a green light, and a blue light may travel to the outside through the red pixel area PXA-R, the green pixel area PXA-G1, and the blue pixel area PXA-B, respectively. Each of the red pixel area PXA-R, the green pixel area PXA-G1, and the blue pixel area PXA-B may have a size greater than that of a corresponding opening among the first, second, and third openings OP1, OP2, and OP3 of the pixel definition layer PDL to increase a light emitting efficiency.

The fourth opening B-OP4 of the light blocking pattern BM may provide an effective sensing area ESA. The effective sensing area ESA may have a size smaller than a size of the sensing area SA. This will be described in detail later.

The anti-reflective layer CFL may include the light absorbing layer LAL. The light absorbing layer LAL may be disposed on the second insulating layer PL and may cover the light blocking pattern BM. FIG. 9 shows a transmittance of the natural light passing through the light absorbing layer LAL as a function of a wavelength. The light absorbing layer LAL may act as a band filter that absorbs a light in a specific wavelength band.

The light absorbing layer LAL may transmit the red source light, the green source light, and the blue source light described above, and may absorb a light in a wavelength range between the red source light and the green source light and a light in a wavelength range between the green source light and the blue source light. For instance, the light absorbing layer LAL may absorb a light with a wavelength from about 490 nm to about 505 nm and a light with a wavelength from about 585 nm to about 600 nm.

The light absorbing layer LAL may include a base resin and a dye or pigment mixed with the base resin. The light absorbing layer LAL may include a first dye or a first pigment that absorbs a light having a wavelength from about 490 nm to about 505 nm. The light absorbing layer LAL may include a second dye or a second pigment absorbing a light having a wavelength from about 585 nm to about 600 M.

Referring to FIG. 8B, when the display device DD operates, each of the red, green, and blue light emitting elements ED_R, ED_G1, and ED_B may emit a source light. The red light emitting elements ED_R may emit a red light in a red wavelength band. The green light emitting elements ED_G1 may emit a green light in a green wavelength band, and the blue light emitting elements ED_B may emit a blue light in a blue wavelength band.

The source light generated by the light emitting element disposed around or adjacent to the first optical sensing element OPD1 may be reflected by the user's fingerprint that is on an upper surface of the window WM. The first optical sensing element OPD1 may receive the reflected light RL passing through the effective sensing area ESA.

According to an embodiment of the present invention, one of a red color filter, a green color filter, and/or a blue color filter may be disposed to overlap the fourth opening B-OP4. In this case, the color filter may selectively provide only one reflected light among the red reflected light, the green reflected light, and the blue reflected light to the first optical sensing element OPD1.

An effective fingerprint area EPA may be defined in the upper surface of the window WM to correspond to one optical sensing element OPD1. The effective fingerprint area EPA may be defined as an area where an effective reflected light RL, which reaches the optical sensing element OPD1 through the effective sensing area ESA, is generated or reflected when the user's finger touches the upper surface of the window WM.

The reflected light RL may include information about the fingerprint, e.g., information about ridges or valleys between the ridges of the fingerprint. A light reflected from an area outside the effective fingerprint area EPA might not pass through the fourth opening B-OP4, and as a result, the first optical sensing element OPD1 may obtain only information about the fingerprint overlapping the effective fingerprint area EPA.

As a size of the effective sensing area ESA decreases, a size of the effective fingerprint area EPA may decrease. As a size or a length in cross-section of the fourth opening B-OP4 decreases, the size or length in cross-section of the effective sensing area ESA may decrease.

The reflected light RL may pass through the opening L-OP of the low reflective inorganic layer LRL. Accordingly, the reflected light RL may be prevented from being reflected from the low reflective inorganic layer LRL, and a reduction in amount of the reflected light RL provided to the first optical sensing element OPD1 may be prevented.

Referring to FIG. 8C, the capping layer CPL may be provided with an opening C-OP defined therethrough to correspond to (e.g., overlap) the opening L-OP of the low reflective inorganic layer LRL. The reflected light RL may pass through the opening L-OP of the low reflective inorganic layer LRL and the opening C-OP of the capping layer CPL. Accordingly, the reflected light RL may be prevented from being reflected from the capping layer CPL, and the reduction in amount of the reflected light RL provided to the first optical sensing element OPD1 may be prevented.

Figure 10A:
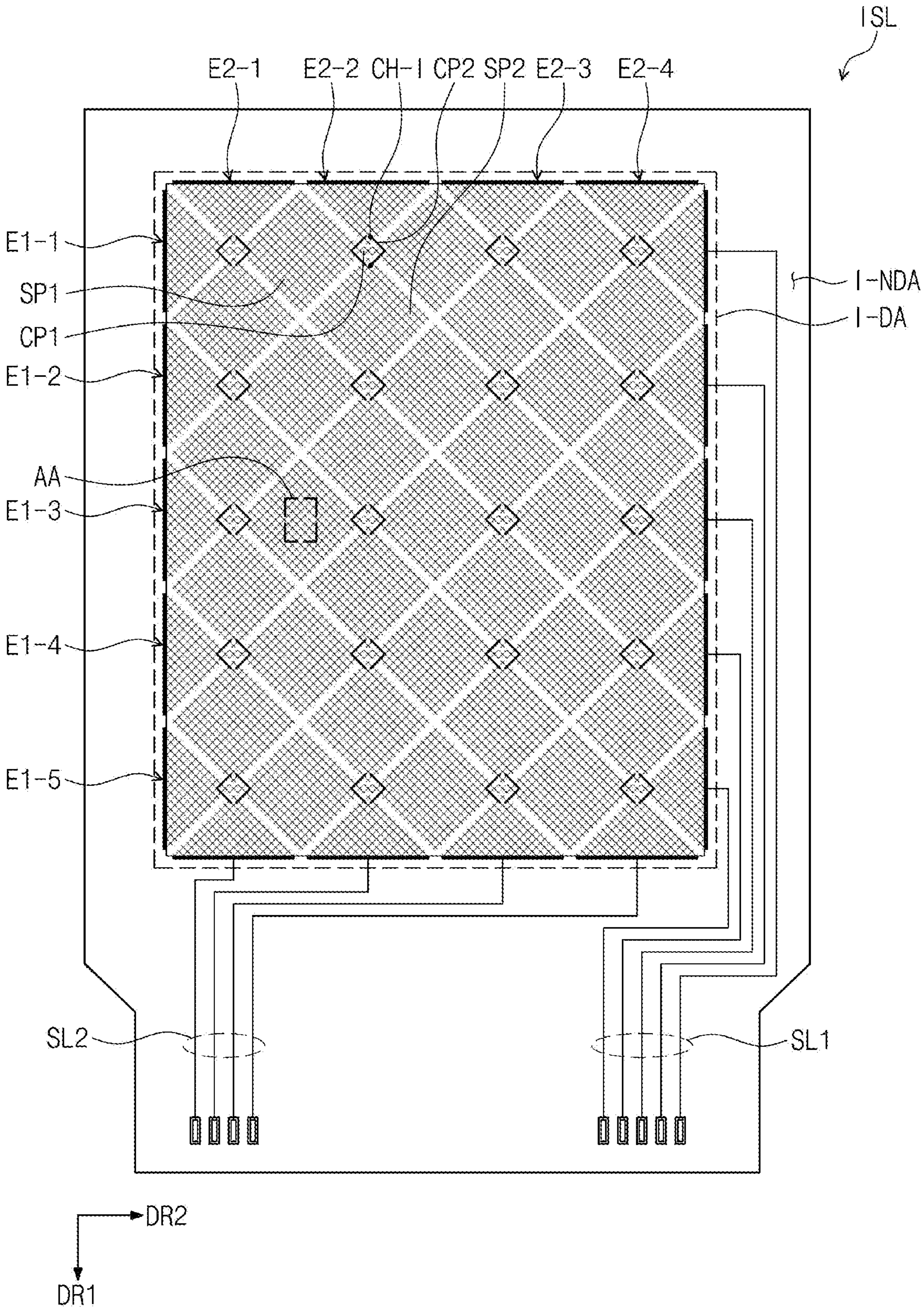
FIG. 10A is a plan view of an input sensor according to an embodiment of the present invention.
Figure 10B:
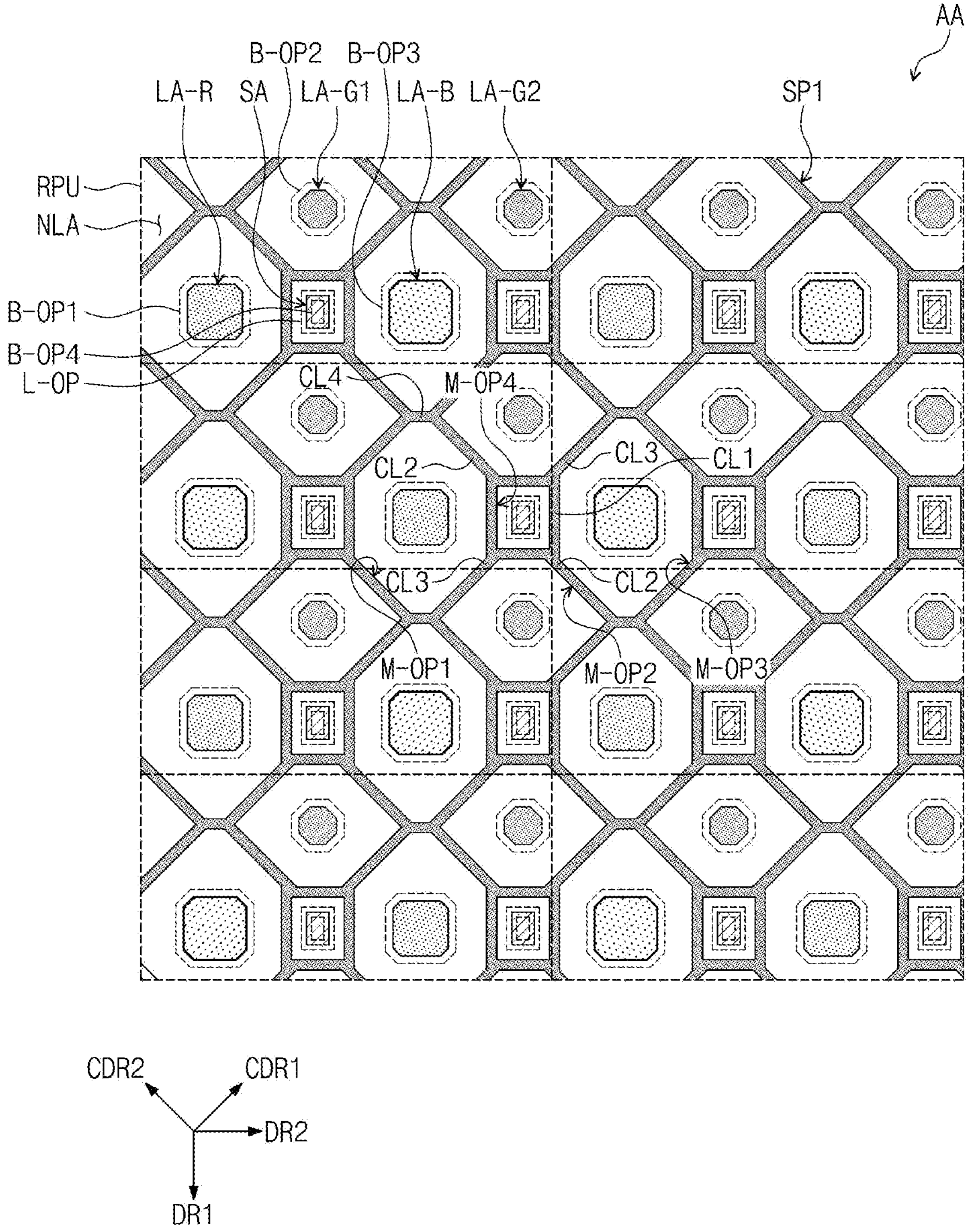
FIG. 10B is an enlarged plan view of a portion of the input sensor of FIG. 10A.

FIG. 10A is a plan view of the input sensor ISL according to an embodiment of the present invention. FIG. 10B is an enlarged plan view of a portion AA of the input sensor ISL of FIG. 10A.

Referring to FIG. 10A, the input sensor ISL may include a sensing area I-DA and a non-sensing area I-NDA adjacent to the sensing area I-DA. The sensing area I-DA and the non-sensing area I-NDA may respectively correspond to the display area DA and the non-display area NDA shown in FIG. 3.

The input sensor ISL may include first electrodes E1-1 to E1-5 and second electrodes E2-1 to E2-4, which are disposed in the sensing area I-DA and are insulated from each other while crossing each other. The input sensor ISL may include first signal lines SL1 and second signal lines SL2. The first signal lines SL1 may be disposed in the non-sensing area I-NDA and may be electrically connected to the first electrodes E1-1 to E1-5, and the second signal lines SL2 may be disposed in the non-sensing area I-NDA and may be electrically connected to the second electrodes E2-1 to E2-4. The first electrodes E1-1 to E1-5, the second electrodes E2-1 to E2-4, the first signal lines SL1, and the second signal lines SL2 may be defined by combinations of the first conductive patterns ICL1 and the second conductive patterns ICL2 described with reference to FIGS. 8A and 8B.

Each of the first electrodes E1-1 to E1-5 and the second electrodes E2-1 to E2-4 may include a plurality of conductive lines crossing each other. The conductive lines may form a plurality of openings, and each of the first electrodes E1-1 to E1-5 and the second electrodes E2-4 to E2-4 may have a mesh shape.

One of the first electrodes E1-1 to E1-5 and the second electrodes E2-4 to E2-4 may have an integral shape. In the present embodiment, the first electrodes E1-1 to E1-5 may have the integral shape. The first electrodes E1-1 to E1-5 may include sensing portions SP1 and intermediate portions CP1. A portion of the second conductive patterns ICL2 described with reference to FIGS. 8A and 8B may correspond to the first electrodes E1-1 to E1-5.

Each of the second electrodes E2-1 to E2-4 may include sensing patterns SP2 and bridge patterns CP2 (or referred to as connection patterns). In the present embodiment, the bridge patterns CP2 may be formed from the first conductive patterns ICL1 shown in FIGS. 8A and 8B, and the first electrodes E1-1 to E1-5 and the sensing patterns SP2 may be formed from the second conductive patterns ICL2, however, they should not be limited thereto or thereby. According to an embodiment of the present invention, the first electrodes E1-1 to E1-5 and the sensing patterns SP2 may be formed from the first conductive patterns ICL1 shown in FIGS. 8A and 8B, and the bridge patterns CP2 may be formed from the second conductive patterns ICL2 shown in FIGS. 8A and 8B.

One of the first signal lines SL1 and the second signal lines SL2 may receive a transmission signal from an external circuit to sense the external input, and the other one of the first signal lines SL1 and the second signal lines SL2 may apply a variation in capacitance between the first electrodes E1-1 to E1-5 and the second electrodes E2-1 to E2-4 to the external circuit as a reception signal.

A portion of the second conductive patterns ICL2 described with reference to FIGS. 8A and 8B may correspond to the first signal lines SL1 and the second signal lines SL2. The first signal lines SL1 and the second signal lines SL2 may have a multi-layer structure and may include a first layer line and a second layer line. The first layer line may be formed from the first conductive patterns ICL1, and the second layer line may be formed from the second conductive patterns ICL2. The first layer line and the second layer line may be connected to each other via a contact hole penetrating the first sensing insulating layer IL.

FIG. 10B shows the red light emitting area LA-R, the green light emitting area LA-G1, the blue light emitting area LA-B, and the sensing area SA of the unit areas RPU, and the first, second, third, and fourth openings B-OP1, B-OP2, B-OP3, and B-OP4 of the light blocking pattern BM (refer to FIGS. 8B and 8C), which respectively correspond to the red light emitting area LA-R, the green light emitting area LA-G1, the blue light emitting area LA-B, and the sensing area SA. When viewed in a plane, the red light emitting area LA-R, the green light emitting area LA-G1, and the blue light emitting area LA-B may be disposed inside the first opening B-OP1, the second opening B-OP2, and the third opening B-OP3, respectively.

When viewed in the plane, the fourth opening B-OP4 may be disposed inside the sensing area SA. In addition, the sensing area SA may be disposed inside the opening L-OP of the low reflective inorganic layer LRL when viewed in the plane. For example, the opening L-OP of the low reflective inorganic layer LRL may have a shape corresponding to a shape of the sensing area SA when viewed in the plane. In the present embodiment, the opening L-OP of the low reflective inorganic layer LRL may have a quadrangular shape. However, the present invention is not limited thereto. For example, the opening L-OP of the low reflective inorganic layer LRL may have a shape different from the shape of the sensing area SA when viewed in the plane.

The sensing portion SP1 of FIG. 10B represents the first electrodes E1-1 to E1-5 and the second electrodes E2-1 to E2-4 shown in FIG. 10A, and a shape of the first electrodes E1-1 to E1-5 and a shape of the second electrodes E2-1 to E2-4 will be described in detail with reference to the sensing portion SP1 of FIG. 10B.

The sensing portion SP1 may include a plurality of line portions. The line portions may overlap the light blocking pattern BM when viewed in the plane.

The sensing portion SP1 may include a first line portion CL1. As shown in FIG. 10B, the first line portion CL1 may form an opening M-OP4 (hereinafter, referred to as a fourth opening) corresponding to the fourth opening B-OP4 of the light blocking pattern BM. When viewed in the plane, the fourth opening M-OP4 of the sensing portion SP1 may be formed outside the fourth opening B-OP4 of the light blocking pattern BM. For example, the fourth opening M-OP4 of the sensing portion SP1 may be larger than that of the fourth opening B-OP4 of the light blocking pattern BM.

The first line portion CL1 may be disposed between the fourth opening B-OP4 and each of the first, second, and third openings B-OP1, B-OP2, and B-OP3 of the sensing portion SP1. The first line portion CL1 may define a rectangular closed-line shape. Two portions of the first line portion CL1 extending in the first direction DR1 may be disposed between the fourth opening B-OP4 and the first opening B-OP1 and between the fourth opening B-OP4 and the third opening B-OP3, respectively. Two portions of the first line portion CL1 extending in the second direction DR2 may be disposed between the fourth opening B-OP4 and one second opening B-OP2 and between the fourth opening B-OP4 and another second opening B-OP2, respectively.

Referring to FIG. 10B, the line portions may further include a second line portion CL2 and a third line portion CL3. The second line portion CL2 may overlap the light blocking pattern BM and may be disposed between the first opening B-OP1 and the second opening B-OP2 when viewed in the plane. The third line portion CL3 may overlap the light blocking pattern BM and may be disposed between the second opening B-OP2 and the third opening B-OP3 when viewed in the plane. Two second line portions CL2 may extend from the first line portion CL1, and two third line portions CL3 may extend from the first line portion CL1. The two second line portions CL2 may extend from two vertices located on a first diagonal line of the first line portion CL1 (or portions adjacent to the two vertices) to directions opposite to each other. The two third line portions CL3 may extend from two vertices located on a second diagonal line of the first line portion CL1 to directions opposite to each other.

One of the second line portions CL2 may extend from the first line portion CL1 in a second cross direction CDR2 crossing the first direction DR1 and the second direction DR2. In FIG. 10B, the two second line portions CL2 are not aligned with each other on the same line and are arranged to be slightly shifted or misaligned from each other, however, the present invention should not be limited thereto or thereby. According to an embodiment of the present invention, the two second line portions CL2 may be aligned on the same line. One of the third line portions CL3 may extend from the first line portion CL1 in a first cross direction CDR1 crossing the first direction DR1, the second direction DR2, and the second cross direction CDR2. In FIG. 10B, the two third line portions CL3 are not aligned with each other on the same line and are arranged to be slightly shifted or misaligned from each other, however, the present invention should not be limited thereto or thereby. According to an embodiment of the present invention, the two third line portions CL3 may be aligned on the same line.

According to the present embodiment, two first line portions CL1, two second line portions CL2, and two third line portions CL3 may be disposed around the first opening B-OP1 of the light blocking pattern BM. The two first line portions CL1 may be disposed spaced apart from each other with the first opening B-OP1 interposed therebetween in the second direction DR2. The two second line portions CL2 may be disposed spaced apart from each other with the first opening B-OP1 interposed therebetween in the second cross direction CDR2. The two third line portions CL3 may be disposed spaced apart from each other with the first opening B-OP1 interposed therebetween in the first cross direction CDR1.

The second line portions CL2 and the third line portions CL3 may be disposed spaced apart from the light emitting areas LA-R, LA-G1, and LA-B therearound. The second line portions CL2 and the third line portions CL3 might not overlap the light emitting areas LA-R, LA-G1, and LA-B therearound.

Two fourth line portions CL4 may be further disposed around the first opening B-OP1. The two fourth line portions CL4 may be disposed spaced apart from each other with the first opening B-OP1 interposed therebetween in the first direction DR1. Each of the fourth line portions CIA may be disposed between the second line portion CL2 and the third line portion CL3 adjacent to the second line portion CL2. According to an embodiment of the present invention, the fourth line portions CL4 may be omitted, and the second line portion CL2 may be directly connected to the third line portion CL3.

Two first line portions CL1, two second line portions CL2, two third line portions CL3, and two fourth line portions CL4 may form an opening M-OP1 (hereinafter, referred to as a first opening) corresponding to the first opening B-OP1 of the light blocking pattern BM. Similar to the first opening M-OP1 of the sensing portion SP1, an opening M-OP3 (hereinafter, referred to as a third opening) corresponding to the third opening B-OP3 may be formed by two first line portions CL1, two second line portions CL2, two third line portions CL3, and two fourth line portions CL4.

Two first line portions CL1, two second line portions CL2, and two third line portions CL3 may be disposed around the second opening B-OP2 of the light blocking pattern BM. The two first line portions CL1 may be disposed spaced apart from each other with the second opening B-OP2 interposed therebetween in the first direction DR1. The two second line portions CL2 may be disposed spaced apart from each other with the second opening B-OP2 interposed therebetween in the first cross direction CDR1. The two third line portions CL3 may be disposed spaced apart from each other with the second opening B-OP2 interposed therebetween in the second cross direction CDR2. The two first line portions CL1, the two second line portions CL2, and the two third line portions CL3 may form an opening M-OP2 (hereinafter, referred to as a second opening) corresponding to the second opening B-OP2 of the light blocking pattern BM.

Consequently, the first line portion CL1 may commonly form the fourth opening M-OP4 and each of the first, second, and third openings M-OP1, M-OP2, and M-OP3. Each of the second line portion CL2 and the third line portion CL3 may commonly form two openings adjacent to each other among the first, second, and third openings M-OP1, M-OP2, and M-OP3.

While the present invention has been described with reference to embodiments thereof, it will be understood by those of ordinary skill in the art that various changes in form and details may be made thereto without departing from the spirit and scope of the present invention.

What is claimed is:

1. A display device comprising:

a base layer comprising a light emitting area, a sensing area, and a non-light-emitting area disposed between the light emitting area and the sensing area;

a light emitting element disposed in the light emitting area;

an optical sensing element disposed in the sensing area;

a capping layer disposed on the light emitting element and the optical sensing element and overlapping the light emitting area, the sensing area, and the non-light-emitting area;

an inorganic layer disposed on the capping layer and including a first opening configured to expose a portion of the capping layer, the first opening overlapping the sensing area; and a thin film encapsulation layer disposed on the inorganic layer and comprising a first encapsulation inorganic layer, an encapsulation organic layer disposed on the first encapsulation inorganic layer, and a second encapsulation inorganic layer disposed on the encapsulation organic layer, wherein the capping layer directly contacts the thin film encapsulation layer through the first opening.

2. The display device of claim 1, wherein the capping layer and the inorganic layer satisfy the following Equation 1 of $$T1+T2=\left\{\frac{\lambda}{4}\times\frac{1}{n1}\right\}+\left\{\frac{\lambda}{4}\times\frac{1}{n2}\right\},$$

wherein λ denotes a wavelength of a visible light, T1 denotes a thickness of the capping layer, T2 denotes a thickness of the inorganic layer, n1 denotes a refractive index of the capping layer at the λ wavelength, and n2 denotes a refractive index of the inorganic layer at the λ wavelength.

3. The display device of claim 1, wherein the inorganic layer comprises bismuth.

4. The display device of claim 1, wherein the capping layer comprises an organic material.

5. The display device of claim 1, wherein the capping layer comprises α-NPD, NPB, TPD, m-MTDATA, Alq3, CuPc, TPD15(N4,N4,N4',N4'-tetra (biphenyl-4-yl) biphenyl-4,4'-diamine), TCTA(4,4',4"-Tris(carbazol sol-9-yl) triphenylamine), an epoxy resin, or an acrylate resin.

6. The display device of claim 1, further comprising an input sensing electrode disposed on the thin film encapsulation layer.

7. The display device of claim 6, wherein the input sensing electrode includes second openings overlapping the light emitting area and the sensing area.

8. The display device of claim 7, further comprising a light blocking pattern disposed on the input sensing electrode and overlapping the non-light-emitting area.

9. The display device of claim 8, wherein the light blocking pattern includes third openings overlapping the second openings.

10. The display device of claim 9, wherein the first opening overlaps a corresponding third opening among the third openings, and the corresponding third opening is disposed inside the first opening when viewed in a plane.

11. The display device of claim 6, further comprising a light absorbing layer disposed on the input sensing electrode, wherein the light absorbing layer absorbs a light having a wavelength ranging from about 490 nm to about 505 nm and a light having a wavelength ranging from about 585 nm to about 600 nm.

12. The display device of claim 11, wherein the light absorbing layer overlaps the light emitting area, the sensing area, and the non-light-emitting area.

13. The display device of claim 11, wherein the light absorbing layer comprises a base resin and a dye or a pigment mixed with the base resin.

14. The display device of claim 1, wherein the capping layer includes a fourth opening overlapping the first opening.

15. The display device of claim 1, wherein the light emitting element comprises first color light emitting elements, second color light emitting elements, and third color light emitting elements, wherein one first color light emitting element, two second color light emitting elements, and one third color light emitting element form a unit light emitting element, and two optical sensing elements are disposed to correspond to the unit light emitting element.

16. The display device of claim 1, wherein the light emitting element comprises first color light emitting elements, second color light emitting elements, and third color light emitting elements, and the optical sensing element is disposed at a center of an area defined by one first color light emitting element, two second color light emitting elements, and one third color light emitting element.

17. An electronic device comprising:

a display device comprising:

a base layer comprising a light emitting area, a sensing area, and a non-light-emitting area disposed between the light emitting area and the sensing area;

a light emitting element disposed in the light emitting area and comprising a first electrode, a second electrode disposed on the first electrode, and a light emitting layer disposed between the first electrode and the second electrode;

an optical sensing element disposed in the sensing area and comprising a first electrode, a second electrode disposed on the first electrode, and a photoelectric conversion layer disposed between the first electrode and the second electrode;

an organic layer disposed on the second electrode of the light emitting element and the second electrode of the optical sensing element, and overlapping the light emitting area, the sensing area, and the non-light-emitting area;

an inorganic layer disposed on the organic layer and including a first opening configured to expose a portion of the organic layer, the first opening overlapping the sensing area; and a thin film encapsulation layer disposed on the inorganic layer and comprising a first encapsulation inorganic layer, an encapsulation organic layer disposed on the first encapsulation inorganic layer, and a second encapsulation inorganic layer disposed on the encapsulation organic layer, wherein the organic layer directly contacts the thin film encapsulation layer through the first opening, and wherein a first reflected light reflected by the inorganic layer is destructively interfered with a second reflected light reflected by the second electrode of the light emitting element or the second electrode of the optical sensing element.

18. The electronic device of claim 17, wherein the inorganic layer comprises bismuth.

19. The electronic device of claim 17, further comprising a light absorbing layer disposed on the thin film encapsulation layer, wherein the light absorbing layer absorbs a light having a wavelength ranging from about 490 nm to about 505 nm and a light having a wavelength ranging from about 585 nm to about 600 nm.

* * * * *